(12) United States Patent
Fujinaga et al.

(10) Patent No.: US 6,927,594 B2
(45) Date of Patent: Aug. 9, 2005

(54) EVALUATION DEVICE FOR EVALUATING SEMICONDUCTOR DEVICE

(75) Inventors: Sugao Fujinaga, Kyoto (JP); Nobuyuki Moriwaki, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 67 days.

(21) Appl. No.: 10/869,872

(22) Filed: Jun. 18, 2004

(65) Prior Publication Data

US 2004/0257104 A1 Dec. 23, 2004

(30) Foreign Application Priority Data

Jun. 18, 2003 (JP) ......................................... 2003-173966

(51) Int. Cl.$^7$ ............................................. G01R 31/26
(52) U.S. Cl. ...................................................... 324/765
(58) Field of Search ............................... 324/158.1, 750, 324/754, 755, 759, 763, 764, 765, 770, 768, 769

(56) References Cited

U.S. PATENT DOCUMENTS 6,041,428 A * 3/2000 Pelagalli et al. ............ 714/734
6,437,633 B2 * 8/2002 Muellner .................... 327/478

FOREIGN PATENT DOCUMENTS

| JP | 7-106385 | 4/1995 |
| JP | 26-30219 | 4/1997 |

* cited by examiner

Primary Examiner—Luan Thai
Assistant Examiner—Trung Q. Nguyen
(74) Attorney, Agent, or Firm—McDermott Will & Emery LLP

(57) ABSTRACT

An evaluation device for evaluating a semiconductor device, used for evaluating electric characteristics of an electrical connection member provided in a vertical direction to a substrate surface, includes a unit circuit having a switching transistor in which a gate thereof connected to a signal line and one of a source and a drain thereof is connected to a first interconnect, and a first resistance element in which one terminal is connected to the other one of the source and the drain of the switching transistor and the other terminal is connected to a second interconnect. The first resistance element constituting each unit circuit includes at least one electrical connection member.

25 Claims, 18 Drawing Sheets

EVALUATION DEVICE FOR EVALUATING SEMICONDUCTOR DEVICE

BACKGROUND OF THE INVENTION

The present invention relates to an evaluation device for evaluating electric characteristics of a connection portion made of a contact, a via or the like in a semiconductor device formed on a wafer.

Contacts and vias which are used in a semiconductor device and are for bringing a substrate surface into electrical conduction in the vertical direction to a substrate surface are one of important components. Thus, characteristics of contacts and vias are one of important evaluation items not only in developing a semiconductor process but also in fabricating a semiconductor device in mass production. Note that, in general, means for electrically connecting an active layer (doped layer) and an interconnect located over the active layer is called "contact" and means for electrically connecting a lower layer interconnect and an upper layer thereon interconnect is called "via".

There are two items which should be evaluated in terms of evaluation of a contact and a via. A first item is whether or not a resistance value of a contact or a via as an initial characteristic is increased, compared to a design value. A second item is reliability. For example, whether or not a resistance value of a contact or a via is increased, compared to an initial value, after a stress (temperature or current) accelerated test is performed should be evaluated.

Hereinafter, a known evaluation device for evaluating a semiconductor device will be described with reference to the accompanied drawings (see e.g., Japanese Patent Publication No. 2630219)

FIRST KNOWN EXAMPLE

FIG. 17 is a plan view schematically illustrating a cross-sectional configuration of an evaluation device for evaluating a semiconductor device according to a first known example.

As shown in FIG. 17, a plane and square p-type well 201 is formed, for example, as a TEG (test element group), on a semiconductor wafer 200 and a plurality of resistance elements 202 connected in series with each other are formed on the p-type well 201.

Ones of the plurality of resistance elements 202 located in end portions of the series connection thereof are electrically connected to a first pad 203 and a second pad 204 provided in a peripheral region of the p-type well 201, respectively. Moreover, the p-type well 201 is electrically connected to a third pad 205 to which a well potential is to be applied.

Each of the resistance elements 202 includes a plurality of n-type active layers (doped layers) 202a, interconnect layers 202b each formed so as to extend over adjacent ones of the n-type active layers 202a and contacts 202c each electrically connecting each of the n-type active layers 202a and each of the interconnect layers 202b.

Hereinafter, the operation of the evaluation device for evaluating a semiconductor device formed so as to have the above-described configuration will be described. First, a stress current is applied to each of the resistance elements 202. Specifically, with the evaluation device for evaluating a semiconductor device kept at a high temperature of, for example, 125° C., the second pad 204 and the third pad 205 are connected to the ground and, subsequently, a voltage is applied to the first pad 203 so that a constant current flows from the first pad 203 to the second pad 204.

Next, a resistance value for the resistance elements 202 is measured. Specifically, the second pad 204 and the third pad 205 are connected to the ground and, subsequently a voltage is applied to the first pad 203 so that a constant current flows from the first pad 203 to the second pad 204. In this state, voltages generated in the first pad 203 and the second pad 204 are measured and a resistance value between the first pad 203 and the second pad 204 is calculated from a value of the applied constant current and a voltage value obtained from the measurement.

SECOND KNOWN EXAMPLE

FIG. 18 is a plan view schematically illustrating a cross-sectional configuration of an evaluation device for evaluating a semiconductor device according to a second known example.

As shown in FIG. 18, in the second known example, a first pad 211, a second pad 212, a third pad 213, . . . , and a final portion pad 214 are provided for each connection terminal (node) in each of the resistance elements 202. Moreover, a p-type well 201 is electrically connected to a pad 215 to which a well potential is to be applied.

Hereinafter, the operation of the evaluation device for evaluating a semiconductor device formed so as to have the above-described configuration will be described. First, a stress current is applied to each of the resistance elements 202. Specifically, with the evaluation device for evaluating a semiconductor device kept at a high temperature of, for example, 125° C., the final portion pad 214 and a well potential pad 215 are connected to the ground and, subsequently, a voltage is applied to the first pad 211 so that a constant current flows from the first pad 211 to the final portion pad 214.

Next, a resistance value of the resistance elements 202 is measured. Specifically, the final portion pad 214 and the well potential pad 215 are connected to the ground and, subsequently a voltage is applied to the first pad 211 so that a constant current flows from the first pad 211 to the second pad 212. In this state, voltages generated in the first pad 211 and the second pad 212 are measured and a resistance value between the first pad 211 and the second pad 212 is calculated from a value for the applied constant current.

In the same manner, a voltage is applied to the second pad 212 so that a constant current flows in the direction from the second pad 212 to the third pad 213. In this state, voltages generated in the second pad 212 and the third pad 213 are measured and a resistance value between the second pad 212 and the third pad 213 is calculated from a value for the applied constant current. This operation is performed successively to the rest of the pads.

SUMMARY OF THE INVENTION

With reduction in the size of semiconductor devices, the sizes of contacts and vias have been reduced, and also layouts in which different interconnect layers are electrically connected to each other through a single-contact or via to increase the integration rate have been used in many cases. The number of so-called "single-contacts" per chip is now as many as 5,000,000.

If it is assumed that the incidence of generation of defective chips due to defects of contacts is 1%, it is necessary to extract a defective contact from 500,000,000 contacts corresponding to 100 chips, specify the location of the defective contact, and furthermore, evaluate the defective contact to analyze it.

Furthermore, in terms of materials, cobalt silicide (CoSi), copper (Cu) and other new materials have been adopted. As for configurations, the SAC (self align contact) configuration, the dual damascene configuration and other new configurations have been used. Accordingly, the incident of generation of defectives of contacts and vias is increased and evaluation and analysis also have become difficult.

Then, an evaluation method which allows evaluation of contacts or via in a large scale in a short time, detection of change of about several tens Ω at minimum in a resistance of a single-contact or -via, and also specification of the location of the change is necessary.

However, the known evaluation device for evaluating a semiconductor device is not capable of detecting a contact or a via with an increased resistance and a sufficient stress current can not be applied. A stress current is applied to a contact or a via to accelerate the generation of defects of the contact or the via. A current value of at least about 2 mA, i.e., a current peak value of charge and discharge of a MOSFET is necessary for the stress current.

Hereinafter, problems of the first and second known examples will be specifically described.

First, when using the semiconductor device evaluation device of FIG. 17 according to the first known example, 5,000,000 single-contacts in a wafer and for a product chip are to be evaluated, for example, 50 evaluation elements each including 100,000 contacts 202c between the first pad 203 and the second pad 204 are necessary for each wafer. Where a resistance value of a single-contact is 20 Ω, the total resistance value of an evaluation element is 2 MΩ (=2000 kΩ). If it is assumed that one of the 100,000 contacts 202c is defective and a resistance value of the defective contact is 20 kΩ, the total resistance value of an evaluation element including the defective contact is 2020 kΩ and this is only 1.0% increase at most, compared to 2000 kΩ in the case where all of the contacts 202c are normal. The difference of about 1.0% is within a tolerance of measurement. Therefore, even if a resist value of a signal contact shows a three-digit change, i.e., a change from 20 Ω to 20 kΩ, the change can not be detected.

Then, description will be made with focus on a stress current. The n-type active layer 202a of FIG. 17 is an n-type semiconductor layer and the p-type well is a p-type semiconductor layer. A reverse threshold voltage in this case is only about 5 V. Accordingly, an upper limit of a voltage applicable to between the first pad 203 and the second pad 204 is 5 V and a stress current is determined to be about 170 nA at maximum from the total resistance value of 30 MΩ. This value is 4 digit smaller than 2 mA, i.e., the necessary current value.

Next, when using the semiconductor device evaluation device of FIG. 18 according to the second known example, 5,000,000 single-contacts on a wafer and for a product chip are to be evaluated, for example, 50 evaluation elements each including 100,000 contacts 202c between the first pad 211 and the final portion pad 214 are necessary for each wafer. Now, description will be made with focus on a single evaluation element. Assume that a plurality of pads 212, 213, . . . are provided between the first pad 211 and the final portion pad 214 and, for example, 10 of the contacts 202c (the total resistance value is 200 Ω, i.e., 20 Ω per contact) can be evaluated between every two adjacent pads. In this case, 10,000 pads have to be provided between the first pad 211 and the final portion pad 214. If it is assumed that one of the 10 contacts 202c is defective and a resistance value of the defective contact is 20 kΩ, the total resistance value of the 10 contacts including the defective contact is 20180 Ω and thus the defective contact can be detected with high sensitivity in a simple manner. Furthermore, a stress current of 2 mA or more can be made to flow in a simple manner.

However, the number of target evaluation elements per wafer is as many as 500,000 and also measurement (application of a voltage and measurement of current) of each element requires 30 ms. Thus, it takes 4 hours or more to perform measurement to each wafer.

As has been described, the semiconductor device evaluation device of the second known example is suitable for evaluating a relatively small scale integrated circuit but it is not realistic to use the evaluation device in evaluating a large scale integrated circuit.

It is therefore an object of the present invention to solve the above-described known problems and make it possible to evaluate contacts or vias in a large scale in a short time, detect a change of about several tens Ω at minimum in a resistance of a single-contact or -via, specify the location of a defective contact and, furthermore, apply a sufficient stress current.

To achieve the object, according to the present invention, an evaluation device for evaluating a semiconductor device is fabricated so as to have a configuration in which a plurality of resistance elements can be selectively brought into conduction by providing a switching transistor for each resistance element to be evaluated.

More specifically, a first evaluation device for evaluating a semiconductor device according to the present invention is directed to an evaluation device for evaluating a semiconductor device, which is formed on a substrate and used for evaluating electric characteristics of an electrical connection member provided in a vertical direction to the substrate. The evaluation device includes: a unit circuit including a switching transistor in which a gate thereof connected to a signal line and one of a source and a drain thereof connected to a first interconnect, and a first resistance element having one terminal connected to the other one of the source and the drain of the switching transistor and the other terminal connected to a second interconnect. In the evaluation device, the first resistance element includes at least one electrical connection member.

According to the first evaluation device for evaluating a semiconductor device, a switching transistor is provided for a first resistance element including at least one electrical connection member constituting a unit circuit and provided in a vertical direction to a substrate surface. Thus, even if the size of the first resistance element is reduced and large scale integration is carried out, the location of a defective electrical connection member can be specified in a short time by selectively bringing the switching transistor into conduction. Moreover, said at least one electrical connection member is provided so that many electrical connection members are not connected in series with each other. Thus, a change of about several tens Ω at minimum in the resistance of each electrical connection member can be detected. Furthermore, a sufficient stress current can be applied. As a result, a defective contact or via is detected from several hundred million contacts or vias, so that the resistance value of the defective contact or via and the location of the defective one can be specified in a short time.

A second evaluation device for evaluating a semiconductor device according to the present invention is directed to an evaluation device for evaluating a semiconductor device, which is formed on a substrate and used for evaluating electric characteristics of an electrical connection member provided in a vertical direction to a substrate. The evaluation device includes: a unit circuit including a plurality of switching transistors each having a configuration in which a gate thereof connected to a signal line and one of a source and a drain thereof connected to a first interconnect, and a plurality of first resistance elements each having a terminal connected to the other one of the source and the drain of the switching transistor and the other terminal connected to a second interconnect. In the evaluation device, each said first resistance element includes at least one electrical connection member.

According to the second evaluation device for evaluating a semiconductor device, the same effects as those of the first evaluation device of the present invention can be achieved. Moreover, each unit circuit includes a plurality of first resistance elements and a plurality of switching transistors, so that a multiple existence of the first resistance element is achieved. Thus, a time which it takes to apply a stress current and a time it takes to measure a resistance value can be reduced according to the level of multiplex.

It is preferable that the first evaluation device for evaluating a semiconductor device further includes a second resistance element connected between the switching transistor and the first interconnect.

It is preferable that the first evaluation device for evaluating a semiconductor device further includes: a first circuit including a pair of transistors of different conductivity types connected in series between a power supply terminal and a ground terminal with a connection node of the transistors connected to the first interconnect; and a second circuit including a pair of transistors of different conductivity types connected in series between a power supply terminal and a ground terminal with a connection node of the transistors connected to the second interconnect and the first interconnect is connected to a first output terminal via a first voltage detector.

In this case, it is preferable that the second interconnect is connected to a second output terminal via a second voltage detector.

Moreover, in this case, it is preferable that a voltage equal to or higher than a sum of a power supply voltage and a threshold voltage of the switching transistor is applied to the signal line.

It is preferable that the first or second evaluation device for evaluating a semiconductor device includes a plurality of unit circuits and the plurality of unit circuits are arranged in a matrix on the substrate. Thus, the first resistance element including an electrical connection member provided in a vertical direction to a substrate surface can be reliably evaluated.

A third evaluation device for evaluating a semiconductor device according to the present invention is directed to an evaluation device for evaluating a semiconductor device, which is formed on a substrate and used for evaluating electric characteristics of an electrical connection member provided in a vertical direction to a substrate surface. The evaluation device includes: a plurality of unit circuits arranged in a matrix, each including a switching transistor in which a gate thereof connected to an output terminal of a NAND circuit and one of a source and a drain thereof connected to a first interconnect, and a first resistance element having one terminal connected to the other one of the source and the drain of the switching transistor and the other terminal connected to a second interconnect. In the evaluation device, the first resistance element includes at least one electrical connection member, the second interconnect connected to the first resistance element of each one of the plurality of unit circuits belonging to the same row is a single interconnect in a row direction, one input terminal of the NAND circuit included in each one of the plurality of unit circuits belonging to the same row is connected to a row address control section, the first interconnect connected to the switching transistor included in each one of the plurality of unit circuits belonging to the same column is a single interconnect in a column direction, and the other input terminal of the NAND circuit included in each one of the plurality of circuits belonging to the same column is connected to a column address control section.

In the third evaluation device for evaluating a semiconductor device, the first evaluation device for evaluating a semiconductor device is arranged in a matrix and, furthermore, one output terminal of a NAND circuit included in each one of the unit circuits belonging to the same row is connected to a row address control section, and the other input terminal of the NAND circuit included in each one of the unit circuits belonging to the same column connected to a column address control section. Thus, the first resistance element of which the size is reduced and which is formed in a large scale and includes an electrical connection member provided in a vertical direction to a substrate surface can be reliably evaluated.

A fourth evaluation device for evaluating a semiconductor device according to the present invention is directed to an evaluation device for evaluating a semiconductor device, which is formed on a substrate and used for evaluating electrical characteristics of an electrical connection member provided in a vertical direction to a substrate surface. The evaluation device includes: a plurality of unit circuits arranged in a matrix, each including a plurality of switching transistors each having a configuration in which a gate of each said switching transistor connected to an output terminal of a NAND circuit and one of a source and a drain of each said switching transistor is connected to a first interconnect, and a plurality of first resistance elements each having one terminal connected to the other one of the source and the drain of each said switching transistor and the other terminal connected to a second interconnect. In the evaluation device, each said first resistance element includes at least one electrical connection member, the second interconnect connected to the plurality of first resistance elements of each one of the plurality of unit circuits belonging to the same row is a single interconnect in a row direction, one input terminal of the NAND circuit included in each one of the plurality of unit circuits belonging to the same row is connected to a row address control section, the first interconnect connected to the plurality of switching transistors included in each one of the plurality of unit circuits belonging to the same column is a single interconnect in a column direction, and the other input terminal of the NAND circuit included in each one of the plurality of unit circuits belonging to the same column is connected to a column address control section.

With the fourth evaluation device for evaluating a semiconductor device, the same effects as those of the third evaluation device for evaluating a semiconductor device. Moreover, each unit circuit includes a plurality of first resistance elements and a plurality of switching transistors, so that the first resistance elements are provided in a multiplex manner. Thus, a time which it takes to apply a stress current and a time which it takes to measure a resistance value can be reduced according to the level of multiplex.

It is preferable that the third evaluation device for evaluating a semiconductor device further includes: a plurality of first circuits each including a pair of transistors of different conductivity types connected in series between a power supply terminal and a ground terminal with a connection node of the transistors connected to the column direction interconnect; a plurality of second circuits each including a pair of transistors of different conductivity types connected in series between a power supply terminal and a ground terminal with a connection node of the transistors connected to the row direction interconnect; a column driver control section for outputting a control signal to a gate of each of the pair of transistors in each said first circuit; and a row driver control section for outputting a control signal to a gate of each of the pair of transistors in each said second circuit. In the evaluation device, the column direction interconnect the column direction is connected to an output terminal via a voltage detector.

It is preferable that the third evaluation device for evaluating a semiconductor device further includes a plurality of second resistance elements connected between each said switching transistor and the first interconnect.

In this case, it is preferable that each said first resistance element and each said second resistance element are arranged so as to extend over adjacent ones of the plurality of unit circuits.

When the second resistance element is provided, it is preferable that the third evaluation device for evaluating a semiconductor device further includes a self-excited oscillator circuit for outputting a control signal to each of the row address control section, the column address control section, the row driver control section and the column driver control section.

It is preferable that the third evaluation device for evaluating a semiconductor device further includes at least a fuse element for making it possible to select and drive specific one of the plurality of unit circuits.

In the third evaluation device for evaluating a semiconductor device, it is preferable that a current does not flow in respective switching transistors of ones of the plurality of unit circuits located on a diagonal of the matrix.

In the first evaluation device for evaluating a semiconductor device, it is preferable that the substrate is formed of a semiconductor, and the first resistance element includes an active layer formed on the substrate.

In the first evaluation device for evaluating a semiconductor device, it is preferable that the substrate is formed of a semiconductor, and the first resistance element includes a MIS transistor formed on the substrate.

When the second resistance element is provided, in the first evaluation device for evaluating a semiconductor device, it is preferable that the substrate is formed of a semiconductor, and the first resistance element or the second resistance element is an active layer formed on the substrate.

Moreover, when the second resistance element is provided, in the first evaluation device for evaluating a semiconductor device, it is preferable that the substrate is formed of a semiconductor, and at least one of the first resistance element and the second resistance element is a MIS transistor formed on the substrate.

In any one of the first through fourth evaluation devices for evaluating a semiconductor device, it is preferable that the electrical connection member is a contact or a via.

In any one of the first through fourth evaluation devices for evaluating a semiconductor device, it is preferable that the voltage detector (each of first and second voltage detector) is an inverter or a differential amplifier.

DESCRIPTION OF THE PREFERRED EMBODIMENTS (First Embodiment)

A first embodiment of the present invention will be described with reference to the accompanying drawings.

Figure 1:
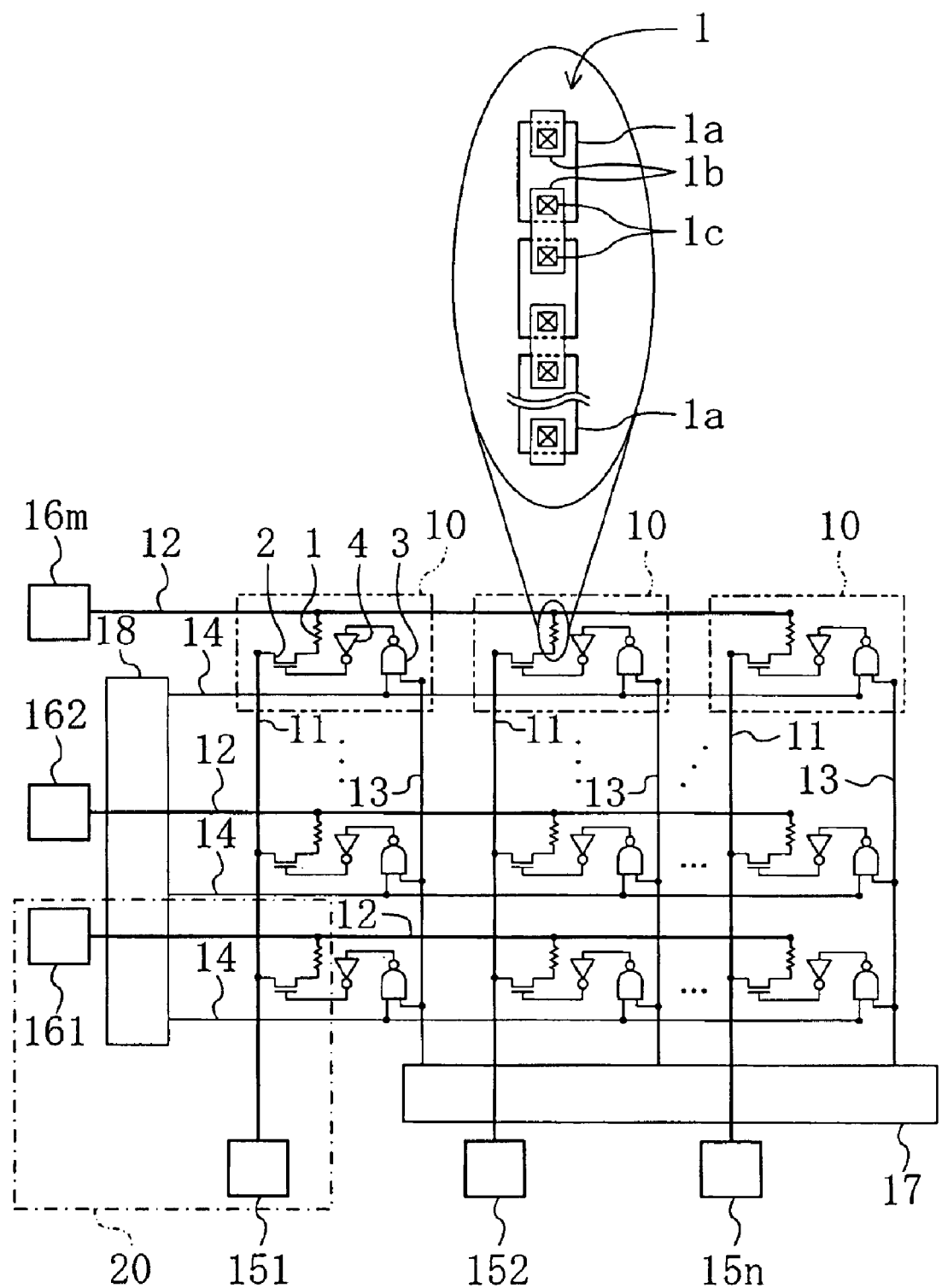
FIG. 1 is a circuit diagram illustrating an evaluation device for evaluating a semiconductor device according to a first embodiment of the present invention.

FIG. 1 is a circuit diagram illustrating the circuit configuration of an evaluation device for evaluating a semiconductor device according to the first embodiment of the present invention.

As shown in FIG. 1, the semiconductor device evaluation device of the first embodiment is, for example, a so-called "TEG (test element group)" formed in part of a semiconductor wafer made of silicon (Si). In the semiconductor device evaluation device, a plurality of unit circuits 10 each including a resistance element 1 to be evaluated and a switching transistor 2 made of an n-type MOSFET with a source connected to a column power supply line 11 and a drain connected to one terminal of the resistance element 1 are arranged in a matrix.

In each of the unit circuits 10, the other terminal of the resistance element 1 is connected to a row power supply line 12, the gate of the switching transistor 2 is connected to an output terminal of a 2-input NAND gate 3 via an inverter 4. One input terminal of the 2-input NAND gate 3 is connected to a column address signal line 13 and the other input terminal of the 2-input NAND gate 3 is connected to a row address signal line 14.

Each column power supply line 11 is connected to a column pad 151, 152, . . . , or 15n (n is 1 or a larger integer than 1). Each row power supply line 12 is connected to a row pad 161, 162, . . . , or 16m (m is 1 or a larger integer than 1).

Moreover, each column address signal line 13 is connected to a column address controller 17 and each row address signal line 14 is connected to a row address controller 18.

As shown in an enlarged view of FIG. 1, each resistance element 1 includes, for example, lower layer interconnects 1a formed on the principal surface of a semiconductor wafer, upper layer interconnects 1b each formed so as to extend over adjacent ones of the lower layer interconnects 1a and vias 1c each serving as an electrical connection member which is for electrically connecting each of the lower layer interconnects 1a and each of the upper layer interconnects 1b and is provided in the vertical direction to a substrate surface. In this manner, the resistance elements of the first embodiment are a via chain including the lower layer interconnects 1a, the upper layer interconnects 1b and the vias 1c. In this case, the number of the vias 1c is, for example, about 1–100.

Note that each of the resistance elements 1 may include, instead of the lower layer interconnects 1a, active layers (doped layers) provided in an upper portion of the semiconductor wafer or active layers (source/drain) of a transistor such as a MOSFET.

Hereinafter, an evaluation method for evaluating a via chain built in a semiconductor device evaluation device formed so as to have the above-described configuration will be described with reference to the accompanying drawings.

Figure 2A:
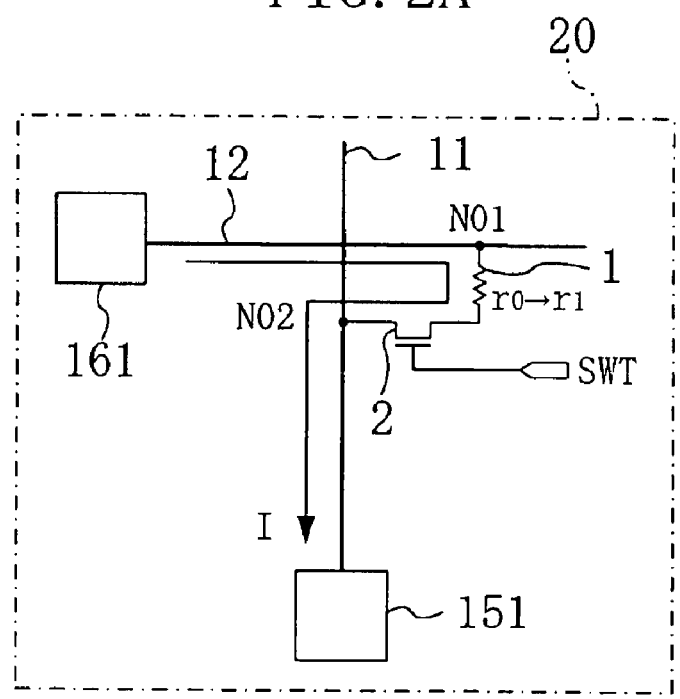
FIG. 2A is a circuit diagram schematically illustrating a stress current applied to a unit circuit constituting the evaluation device for evaluating a semiconductor device according to the first embodiment of the present invention.
Figure 2B:
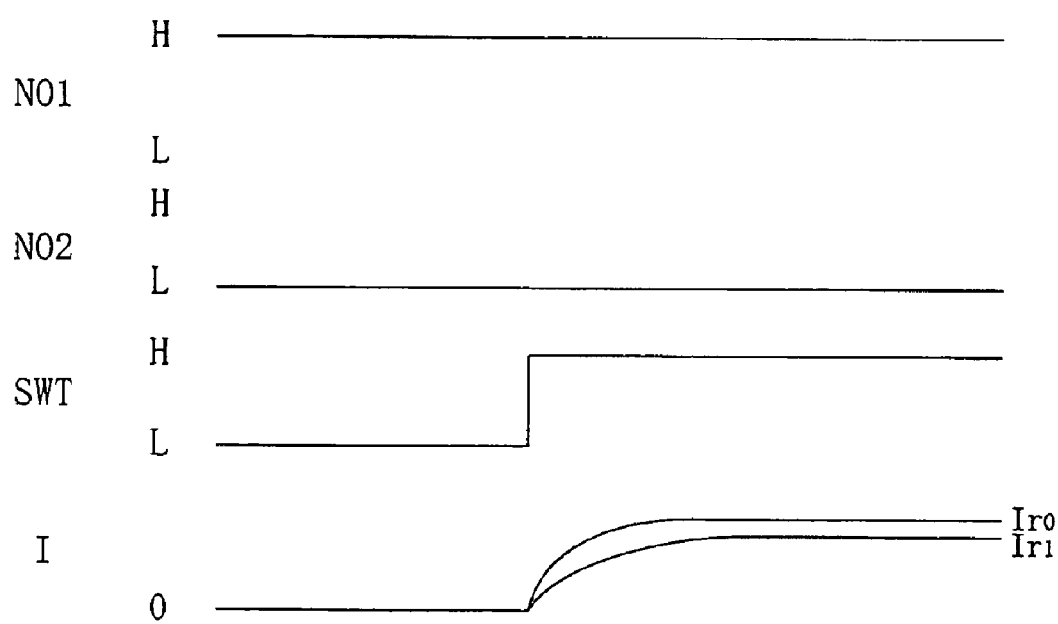
FIG. 2B is a timing chart for evaluating resistance value for a resistance element constituting a unit circuit of the evaluation device for evaluating a semiconductor device according to the first embodiment of the present invention.

FIG. 2A is an enlarged view of a region 20 of FIG. 1. FIG. 2B is a timing chart showing operation timing for the evaluation device.

First, as shown in FIG. 2A, a method for applying a stress current to one of the plurality of unit circuits 10 located, for example, in the first row and the first column will be described.

With a power supply voltage of 1.8 V applied to the row pad 161 and the column pad 151 grounded, a HIGH potential control signal SWT is applied to the gate of the switching transistor 2. In this case, the control signal SWT is generated by address signals from the column address controller 17 and the row address controller 18. As a result, where a resistance value of the resistance element 1 is 300 Ω and an ON resistance of the switching transistor 2 is 100 Ω, a stress current I flowing in the resistor element 1 is 4.5 mA. Therefore, a sufficient stress current can be applied.

With the control signal SWT, application of each of a DC stress and an AC stress is possible by changing the signal level of the control signal SWT.

Next, an evaluation method for evaluating a resistance value for the resistance element 1 will be described.

As shown in FIG. 2B, with a power supply voltage of 1.8 V applied to the row pad 161 and the column pad 151 grounded, a HIGH potential control signal SWT is applied to the gate of the switching transistor 2. Assume that in this state, a current $Ir_0$ flowing in the resistance element 1 is measured and a value for the resistance element 1 is 4.5 mA.

Next, assume that a value for a current $Ir_1$ measured after the stress current I is applied in the above-described manner is reduced by 10% to 4.05 mA. In this case, the resistance value of the resistance element 1 is increased by 15% from 300 Ω to 344 Ω, so that a change of several tens Ω in the resistance of the resistance element 1 can be reliably detected.

Furthermore, in the first embodiment, the column address controller 17 and the row address controller 18 are provided. Thus, one of the plurality of unit circuits 10 arranged in a matrix can be arbitrarily selected. Therefore, it is possible to specify the resistance element 1 with an increased resistance.

As has been described, according to the first embodiment, the switching transistor 2 is provided in each resistance element 1 made of a via chain group. Thus, as memory cells arranged in a matrix, a stress current can be selectively applied to the plurality of unit circuits 10 and a resistance can be selectively measured, thereby performing evaluation. Accordingly, a via chain having a reduced size and integrated in a large scale can be evaluated in a realistic processing time. Therefore, electric characteristics of vias or contacts in a semiconductor integrated circuit device formed on the same semiconductor wafer can be reliably evaluated.

(Second Embodiment)

Hereinafter, a second embodiment of the present invention will be described with reference to the accompanying drawings.

Figure 3:
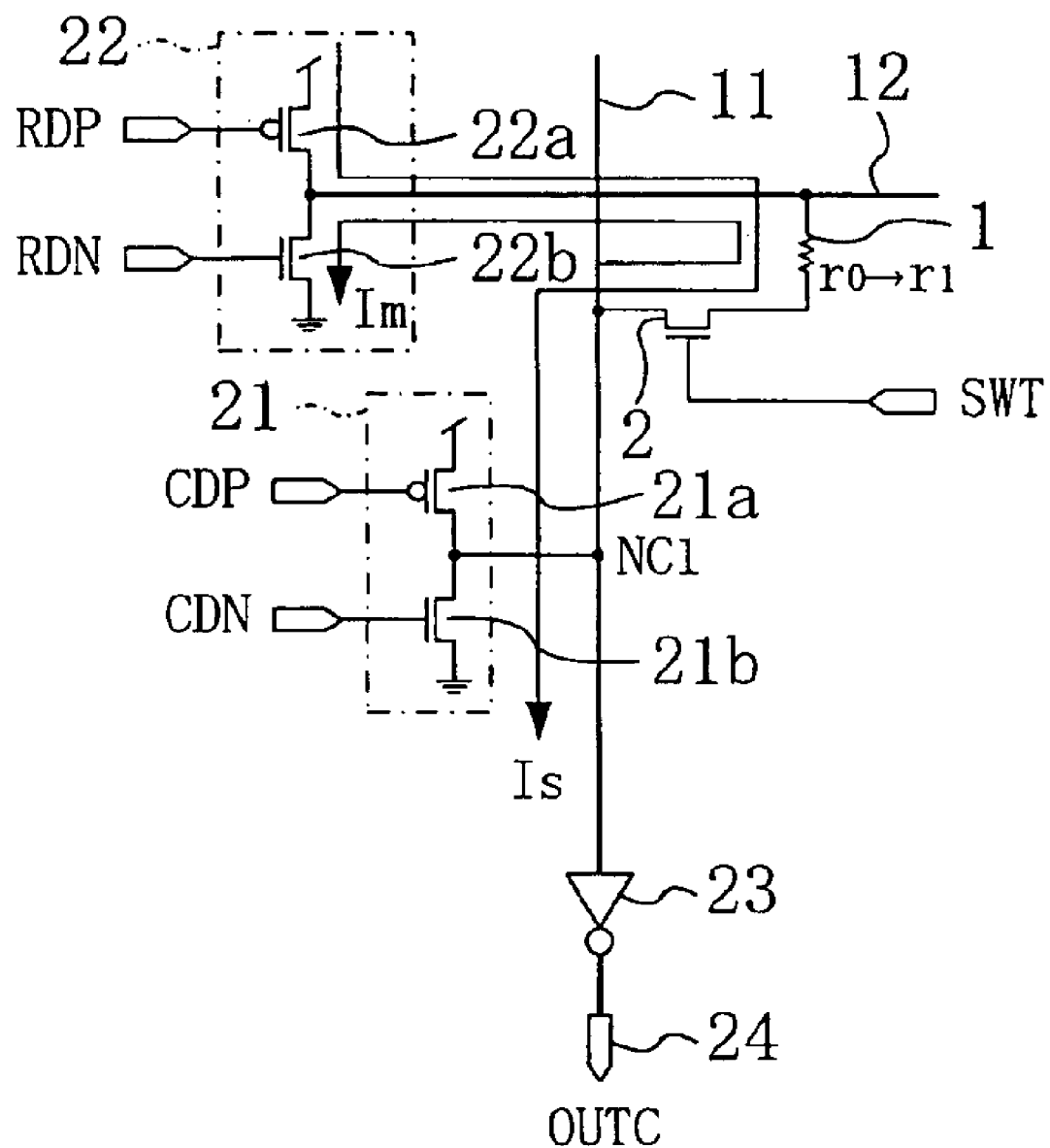
FIG. 3 is a circuit diagram schematically illustrating a unit circuit of an evaluation device for evaluating a semiconductor device according to a second embodiment of the present invention.

FIG. 3 is a circuit diagram illustrating a circuit configuration of a unit circuit of an evaluation device for evaluating a semiconductor device according to the second embodiment of the present invention. In FIG. 3, each member also shown in FIG. 1 is identified by the same reference numeral and therefore description thereof will be omitted.

The evaluation device for evaluating a semiconductor device according to the second embodiment has, in addition to the configuration of the first embodiment, a configuration which allows evaluation of a resistance value of a resistance element in a short time.

As shown in FIG. 3, the semiconductor device evaluation device of the second embodiment includes, instead of the column pads 15n and the row pads 16m, a column driver circuit 21 as a first circuit of which an output terminal is connected to the column power supply line 11, a row driver circuit 22 as a second circuit of which an output terminal is connected to the row power supply line 12, an inverter 23 as a voltage detector connected to the column power supply line 11, and an output terminal 24 for receiving an output signal OUTC of the inverter 23. In this case, the control signal SWT is an output signal from the inverter 4 included in each of the unit circuits 10 of FIG. 1.

The column driver circuit 21 includes a first PMOSFET 21a of which the gate receives a first column drive signal CDP and a first NMOSFET 21b of which the gate receives a second column drive signal CDN. The first PMOSFET 21a and the first NMOSFET 21b are connected in series between the power supply terminal and the ground terminal.

The row driver circuit 22 includes a second PMOSFET 22a of which the gate receives a first row drive signal RDP and a second NMOSFET 22b of which the gate receives a second row drive signal RDN. The second PMOSFET 22a and the second NMOSFET 22b are connected in series between the power supply terminal and the ground terminal.

Hereinafter, an evaluation method for evaluating a via chain built in a semiconductor device evaluation device formed so as to have the above-described configuration will be described with reference to the accompanying drawings.

Figure 4A:
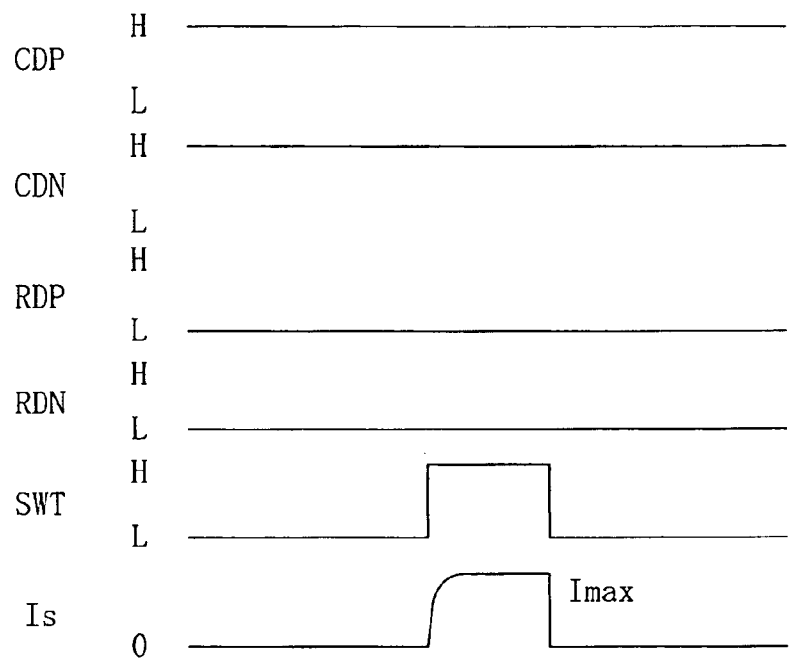
FIG. 4A is a timing chart when a stress current is applied to a resistance element constituting a unit circuit of the evaluation device for evaluating a semiconductor device according to the second embodiment of the present invention.

First, as shown in FIG. 4A, a method for applying a stress current will be described.

Each of signal potentials of the first column drive signal CDP and the second column drive signal CDN is set at a HIGH level and each of signal potentials of the first row drive signal RDP and the second row drive signal RDN is set at a LOW level. In this state, when a signal potential of the control signal SWT is set at the HIGH level, as shown in FIG. 3, a stress current Is flows through the second PMOSFET 22a of the row driver circuit 22, the resistance element 1, the switching transistor 2, and the first NMOSFET 21b of the column driver circuit 21 in this order.

In this case, where the power supply voltage is 1.8 V, the ON resistance of the second PMOSFET 22a is 50 Ω, the resistance value of the resistance element 1 is 300 Ω, the ON resistance of the switching transistor 2 is 100 Ω, and the ON resistance of the first NMOSFET 21b is 50 Ω, a value of the stress current Is is 3.6 mA. Therefore, a sufficient stress current can be applied.

Also, in the second embodiment, with the control signal SWT, application of each of a DC stress and an AC stress is possible by changing the signal level of the control signal SWT.

Next, an evaluation method for evaluating a resistance value of the resistance element 1 will be described.

Figure 4B:
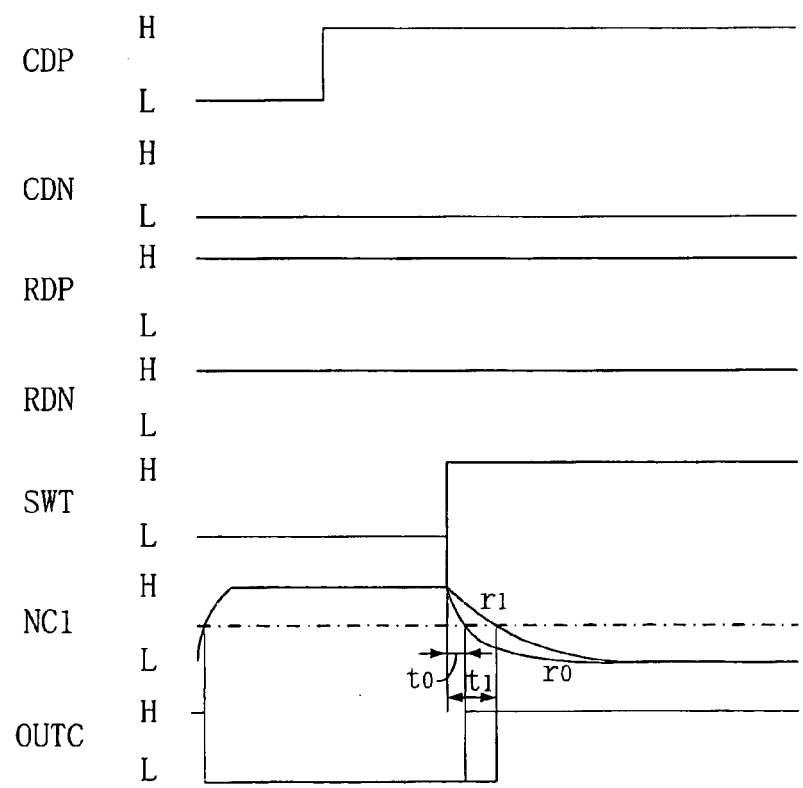
FIG. 4B is a timing chart when a resistance value is measured for a resistance element constituting a unit circuit of the evaluation device for evaluating a semiconductor device according to the second embodiment of the present invention.

As shown in FIG. 4B, with the control signal SWT set at the LOW level, when each of the potentials of the first column drive signal CDP and the second column drive signal CDN is set at the LOW level and each of the potentials of the first row drive signal RDP and the second row drive signal RDN is set the HIGH level, the column power supply line 11 connected to a node NC1, i.e., an output terminal of the column driver circuit 21 is charged by charges from the power supply terminal of the column driver circuit 21 via the first PMOSFET 21a. As a result, the potential of the node NC1 becomes the HIGH level.

Subsequently, after the potential of the node NC1 has become the HIGH level, a transition of the potential of the first column drive signal CDP to the HIGH level is made, thereby making the node NC1 be in a high impedance state. In this high impedance state, the potential of the output signal OUTC in the output terminal 24 is at the LOW level.

Next, a transition of the potential of the control signal SWT to the HIGH level is made, so that charges stored in the column power supply line 11 flow to the ground terminal via the switching transistor 2, the resistance element 1 and the NMOSFET 22b of the row driver circuit 22. The velocity of decrease in the potential at the node NC1 varies according to an outflow level of charges, i.e., the resistance value of the resistance element 1. More specifically, when the resistance value is relatively high, the velocity of decrease in the potential is small, and when the resistance value is relatively low, the velocity of decrease in the potential is large. For example, the resistance value of the resistance element 1 is changed from $r_0$ to $r_1$ (where $r_0 < r_1$) as shown in FIG. 3, the velocity in decrease in the potential at the node NC1 is smaller than that in the case where the resistance value is $r_0$ as shown in FIG. 4B. Thereafter, at the time when the potential at the node NC1 is reduced to half of a HIGH level potential, the potential of the output signal OUTC becomes the HIGH level due to a reverse operation of the inverter 23.

Subsequently, a delay time from the time when a transition of the potential of the control signal SWT to the HIGH level is made to the time when the potential of the output signal OUTC is changed to the HIGH level is converted into an equivalent resistance value. For example, with the power supply potential set at 1.5 V and the resistance value of the resistance element 1 set at a resistance value ranging from 400 Ω to 20 kΩ, when measurement was performed, it has been found that a difference of 1 ns in the delay time corresponds to a difference of about 130 Ω in the resistance. This finding shows that with an interval for a strobe signal set to be 0.1 ns, a resistance change of 13 Ω can be detected.

In this case, a differential amplifier using a potential corresponding to half of the HIGH level potential as a reference potential may be used, instead of the inverter 23.

Figure 5:
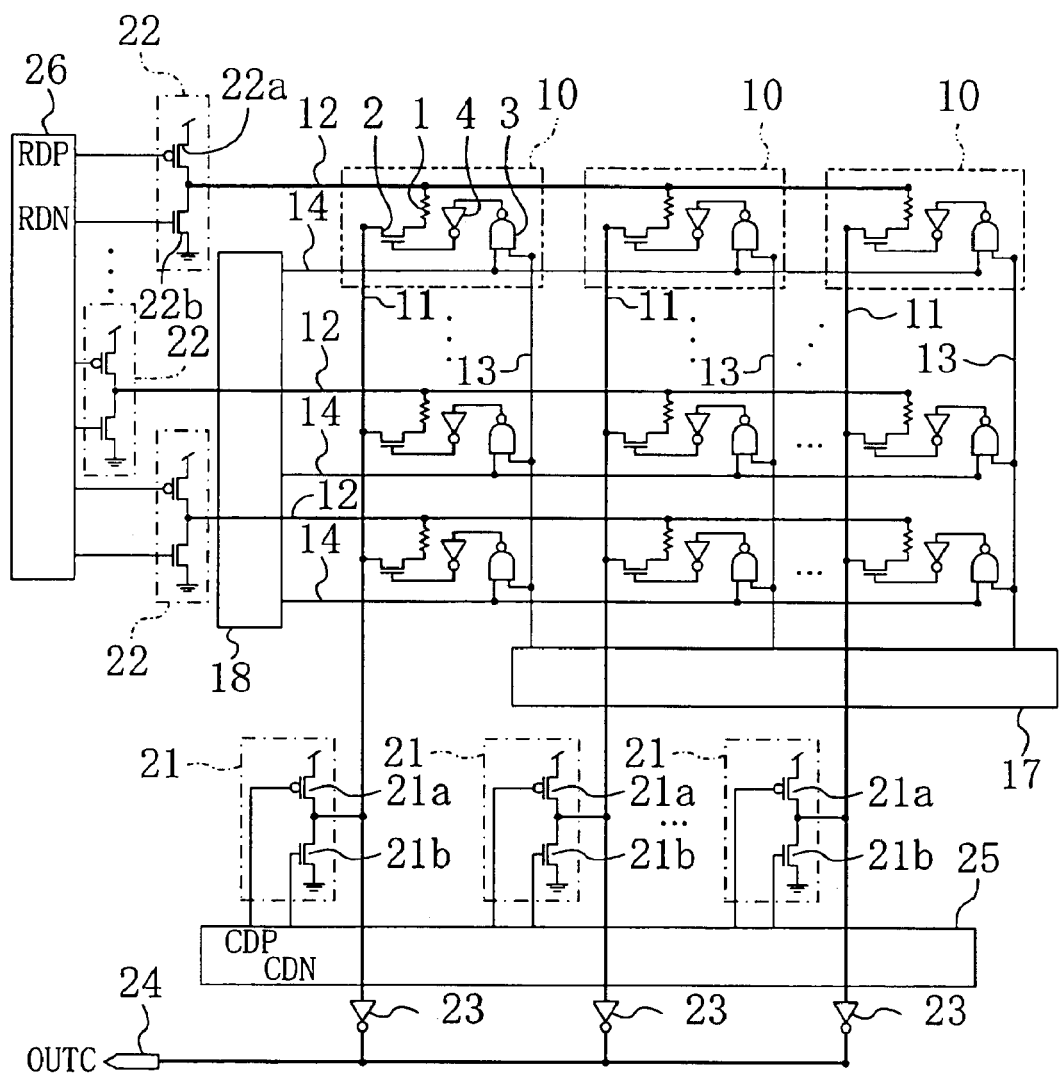
FIG. 5 is a circuit diagram illustrating an evaluation device for evaluating a semiconductor device according to the second embodiment of the present invention.

FIG. 5 is a diagram illustrating an example in which unit circuits according to the configuration of the semiconductor device evaluation device of the second embodiment of the present invention are arranged in a matrix and integrated in a large scale. In FIG. 5, each member also shown in FIG. 1 is identified by the same reference numeral and therefore description thereof will be omitted.

As shown in FIG. 5, an input terminal of each column driver circuit 21 is connected to a column driver controller 25. Specifically, the gate of the first PMOSFET 21a receives the first column drive signal CDP from the column driver controller 25 and the gate of the first NMOSFET 21b receives the second column drive signal CDN from the column driver controller 25.

Moreover, an input terminal of each row driver circuit 22 is connected to a row driver controller 26. Specifically, the gate of the second PMOSFET 22a receives the first row drive signal RDP from the row driver controller 26 and the gate of the second NMOSFET 22b receives the second row drive signal RDN from the row drive controller 26.

The operation and evaluation method of each unit circuit 10 are the same as those which have been already described. Each column power supply line 11 and each row power supply line 12 are selectively controlled by respective signals from the column address controller 17, the column driver controller 25, the row address controller 18 and the row driver controller 26. Thus, a stress current Is can be applied arbitrarily to the plurality of unit circuits 10. As a result, the resistance value of the resistance element 1 in each unit circuit 10 can be measured as a delay time.

With the configuration described above, measurement, which has required 52 days in a known manner, can be performed for 15 ms.

(Third Embodiment)

Hereinafter, a third embodiment of the present invention will be described with reference to the accompanying drawings.

Figure 6:
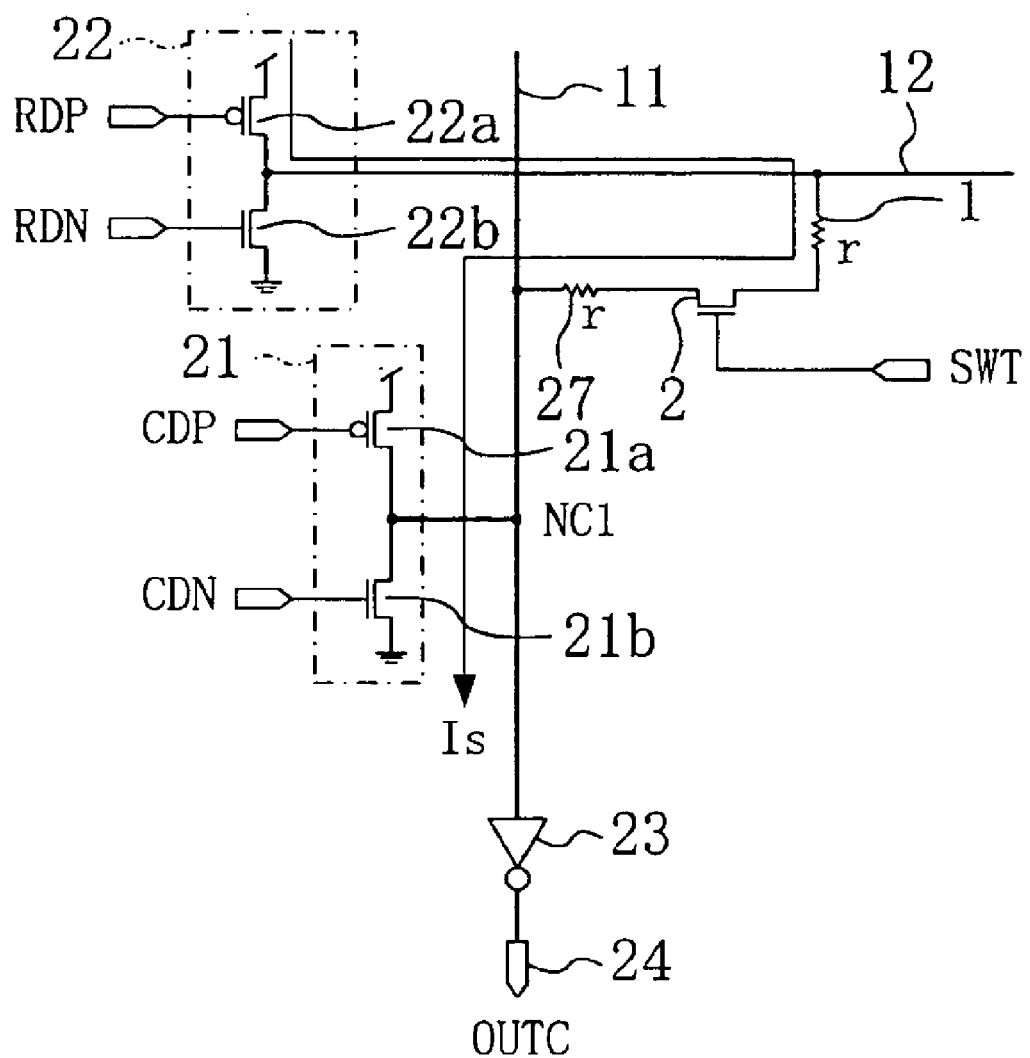
FIG. 6 is a circuit diagram schematically illustrating a unit circuit of an evaluation device for evaluating a semiconductor device according to a third embodiment of the present invention.

FIG. 6 is a circuit diagram illustrating a circuit configuration of a unit circuit of an evaluation device for evaluating a semiconductor device according to a third embodiment of the present invention. In FIG. 6, each member also shown in FIG. 3 is identified by the same reference numeral and therefore description thereof will be omitted.

The semiconductor device evaluation device of the third embodiment has, in addition to the configuration of the second embodiment, a configuration which allows application of a stress current in a reverse direction.

As shown in FIG. 6, the third embodiment is characterized in that a second resistance element 27 is connected between the source of the switching transistor 2 and the column power supply line 11. In this case, the second resistance element 27 is preferably a via chain having the same configuration as that of the first resistance element 1.

Hereinafter, a method for applying a stress current to a via chain built in a semiconductor device evaluation device formed so as to have the above-described configuration will be described with reference to the accompanying drawings.

Figure 7:
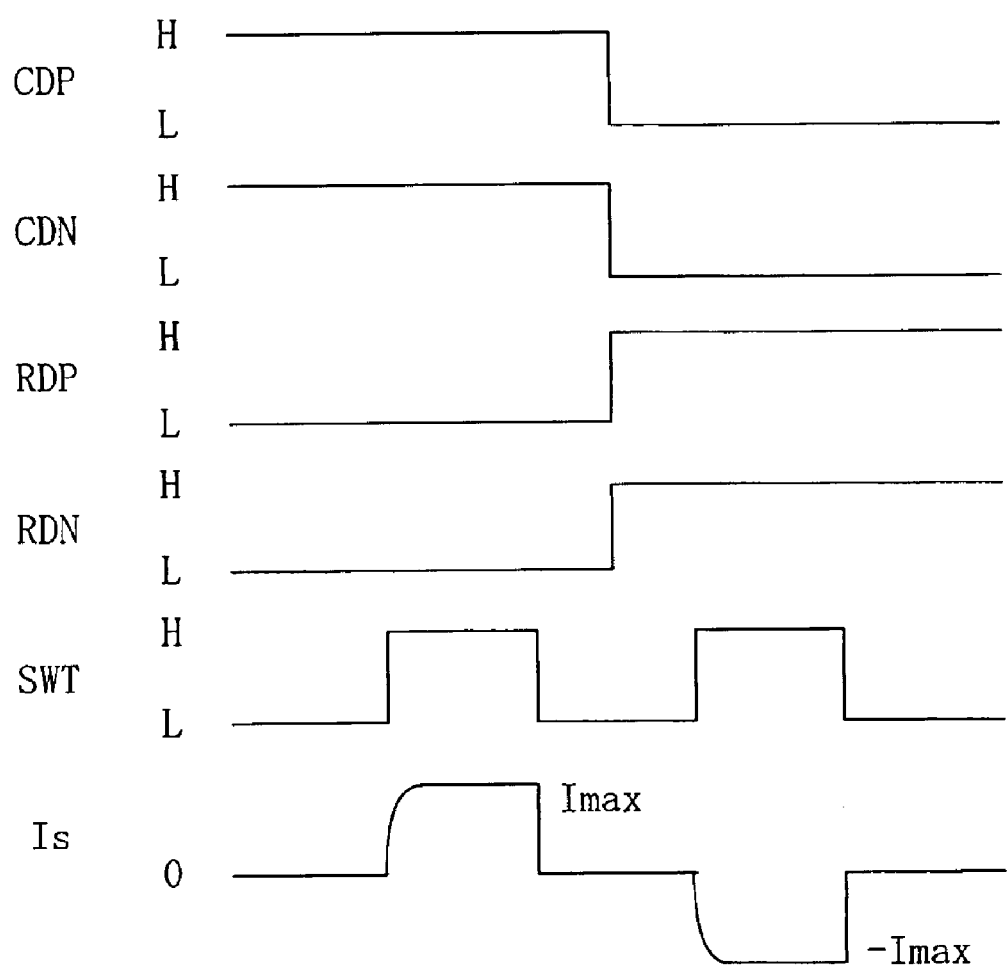
FIG. 7 is a timing chart when a stress current is applied to a resistance element constituting a unit circuit of the evaluation device for evaluating a semiconductor device according to the third embodiment of the present invention.

First, as shown in FIG. 7, each of the signal potentials of the first column drive signal CDP and the second column drive signal CDN is set at the HIGH level and each of the signal potentials of the first row drive signal RDP and the second row drive signal RDN is set at the LOW level. In this state, when a signal potential of the control signal SWT is set at the HIGH level, as shown in FIG. 6, a stress current Is flows through the second PMOSFET 22a of the row driver circuit 22, the first resistance element 1, the switching transistor 2, the second resistance element 27 and the first NMOSFET 21b of the column driver circuit 21 in this order.

Next, when a transition of each of the signal potentials of the first column drive signal CDP and the second drive signal CDN to the LOW level is made whereas a transition of each of the signal potentials of the first row drive signal RDP and the second row drive signal RDN to the HIGH level is made, at this time, the stress current Is flows through the first PMOSFET 21a of the column driver circuit 21, the second resistance element 27, the switching transistor 2, the first resistance element 1, and the second NMOSFET 22b of the row driver circuit 22 in this order.

In this case, where the power supply voltage is 1.8 V, the ON resistance of each of the first PMOSFET 21a and the second PMOSFET 22a is 50 Ω, each of the resistance values of the resistance element 1 and the second resistance element 27 is 300 Ω, the ON resistance of the switching transistor 2 is 100 Ω, and each of the ON resistances of the first NMOSFET 21b and the second NMOSFET 22b is 50 Ω, a value for the stress current Is is 2.0 mA. Therefore, a sufficient stress current can be applied to the first resistance element 1 and the second resistance element 27 while the stress current Is can be applied to each of the column and row directions at the same value.

With the control signal SWT, application of each of a DC stress and an AC stress is possible by changing the signal level of the control signal SWT.

As has been described, the stress current Is can be applied to each of the column and row directions at the same value. Therefore, the selection range of conditions for applying the stress current Is can be increased.

(Fourth Embodiment)

Hereinafter, a fourth embodiment of the present invention will be described with reference to the accompanying drawings.

Figure 8:
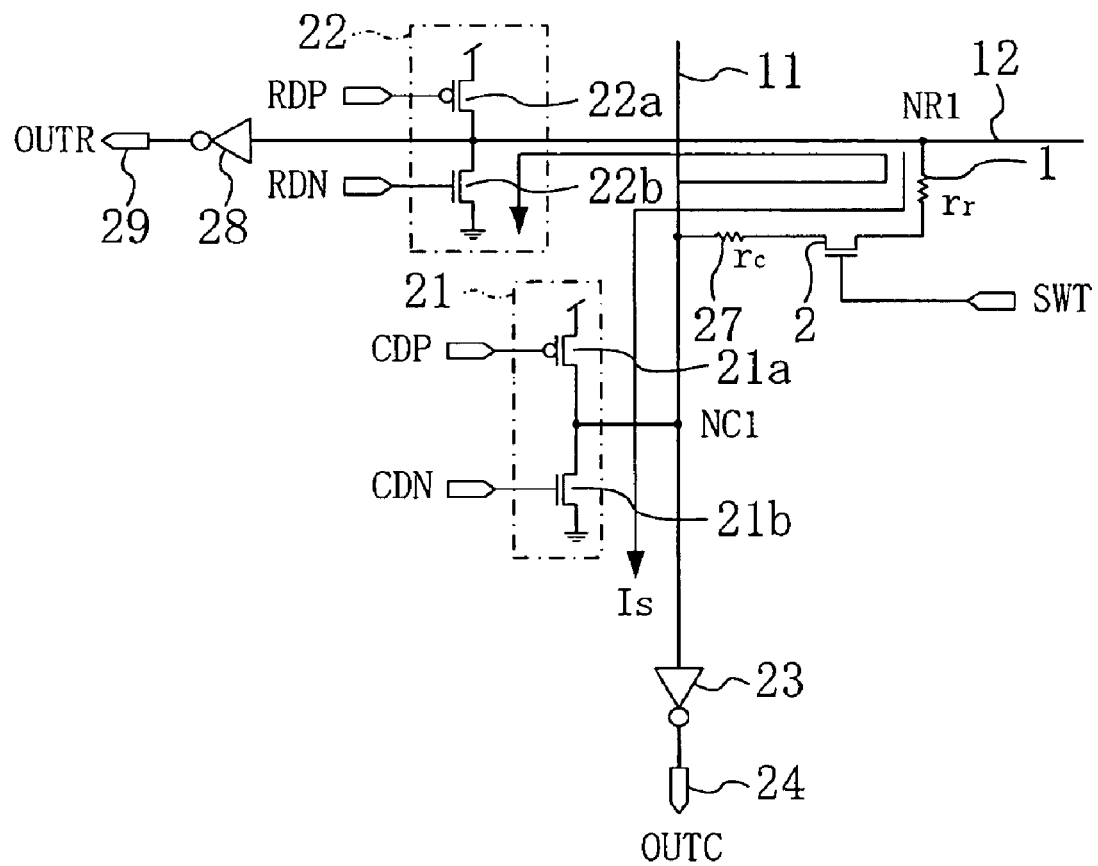
FIG. 8 is a circuit diagram schematically illustrating a unit circuit of an evaluation device for evaluating a semiconductor device according to a fourth embodiment of the present invention.

FIG. 8 is a circuit diagram illustrating a circuit configuration of a unit circuit of an evaluation device for evaluating a semiconductor device according to a fourth embodiment of the present invention. In FIG. 8, each member also shown in FIG. 6 is identified by the same reference numeral and therefore description thereof will be omitted.

The semiconductor device evaluation device of the fourth embodiment has, in addition to the configuration of the third embodiment, a configuration which allows measurement of a resistance value of a resistance element by a row power supply line. Specifically, in the fourth embodiment, a second output terminal 29 is provided at the node NR1, i.e., an output terminal of the row driver circuit 22 via the second inverter 28.

Hereinafter, a method for evaluating a resistance value of a via chain built in a semiconductor device evaluation device formed so as to have the above-described configuration will be described with reference to the accompanying drawings.

First, a method for measuring a resistance value by discharge (column discharge) from the first output terminal 24 of the column power supply line 11 will be described.

Figure 9A:
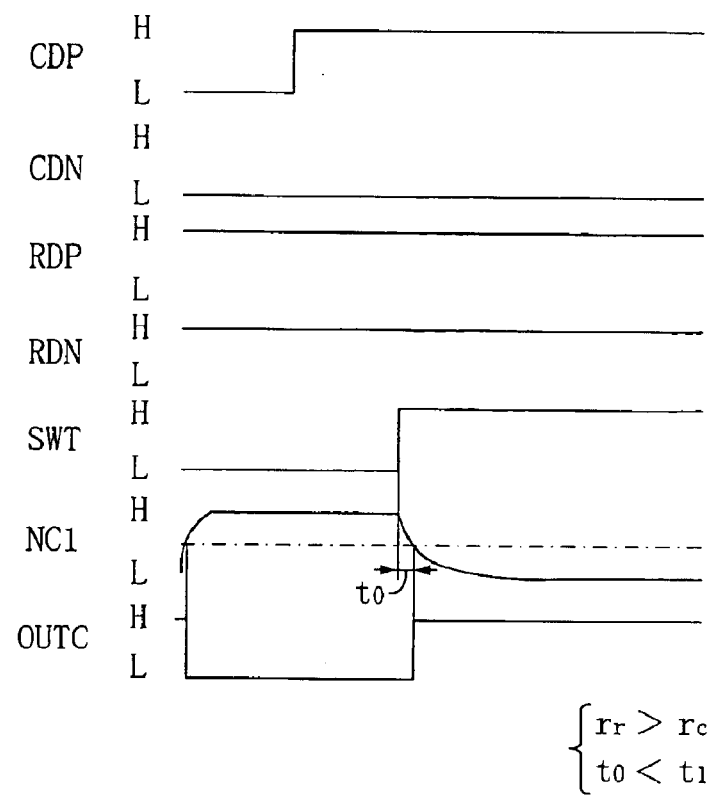
FIG. 9A is a timing chart when a resistance value is measured by discharge for a resistance element constituting a unit circuit of the evaluation device for evaluating a semiconductor device according to the fourth embodiment of the present invention.

As shown in FIG. 9A, with the potential of the control signal SWT set at the LOW level, each of the signal potentials of the first column drive signal CDP and the second column drive signal CDN is set at the LOW level and each of the signal potentials of the first row drive signal RDP and the second row drive signal RDN is set at the HIGH level. Thus, the column power supply line 11 connected to the node NC1 via the first PMOSFET 21a is charged by charges from the power supply terminal of the column driver circuit 21, so that the potential of the node NC1 becomes the HIGH level.

Subsequently, after the potential of the node NC1 has become the HIGH level, a transition of the potential of the first column drive signal CDP to the HIGH level is made, thereby making the node NC1 be in a high impedance state. In this high impedance state, the potential of the output signal OUTC from the first output terminal 24 is at the LOW level.

Next, a transition of the control signal SWT to the HIGH level is made, so that charges stored in the column power supply line 11 connected to the node NC1 flow to the ground terminal of the row driver circuit 22 via the second resistance element 27, the switching transistor 2, the resistance element 1 and the NMOSFET 22b. In this case, the velocity of decrease in the potential at the node NC1 varies according to an outflow level of charges, i.e., the resistance values of the resistance element 1 and the second resistance element 27. More specifically, when the resistance value is relatively high, the velocity of decrease in the potential is small, and when the resistance value is relatively low, the velocity of decrease in the potential is large.

Thereafter, at the time when the potential at the node NC1 is reduced to half of the HIGH level potential, the potential of the output signal OUTC becomes the HIGH level by the first inverter 23. Then, a delay time $t_0$ from the time when a transition of the control signal SWT to the HIGH level is made to the time when the potential of the output signal OUTC is changed to the HIGH level is converted into an equivalent resistance value.

Next, a method for measuring a resistance value by discharge (row discharge) from the second output terminal 29 of the row power supply line 12 will be described.

Figure 9B:
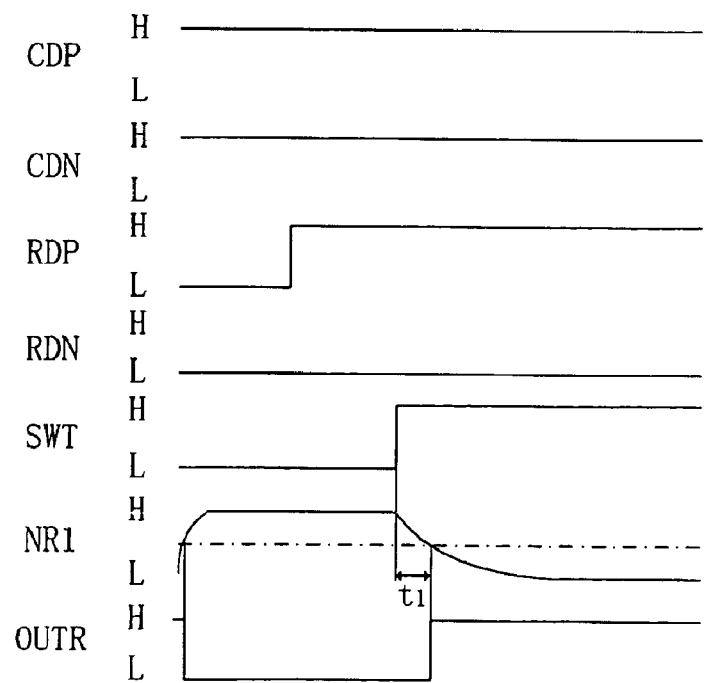
FIG. 9B is a timing chart when a resistance value is measured by charge for a resistance element constituting a unit circuit of the evaluation device for evaluating a semiconductor device according to the fourth embodiment of the present invention.

As shown in FIG. 9B, with the potential of the control signal SWT set at the LOW level, each of the signal potentials of the first column drive signal CDP and the second column drive signal CDN is set at the HIGH level and each of the signal potentials of the first row drive signal RDP and the second row drive signal RDN is set at the LOW level. Thus, the row power supply line 12 connected to the node NR1 via the second PMOSFET 22a is charged by charges from the power supply terminal of the row driver circuit 22, so that the potential of the node NR1 becomes the HIGH level.

Subsequently, after the potential of the node NR1 has become the HIGH level, a transition of the potential of the first row drive signal RDP to the HIGH level is made, thereby making the node NR1 be in a high impedance state. In this high impedance state, the potential of the output signal OUTR from the second output terminal 29 is at the LOW level.

Next, a transition of the control signal SWT to the HIGH level is made, so that charges stored in the row power supply line 12 flow to the ground terminal via the first resistance element 1, the switching transistor 2, the second resistance element 27 and the first NMOSFET 21b. The velocity of decrease in the potential at the node NR1 varies according to the resistance values of the resistance element 1 and the second resistance element 27, as described above.

Thereafter, at the time when the potential at the node NR1 is reduced to half of the HIGH level potential, the potential of the output signal OUTR becomes the HIGH level by the second inverter 28. Then, a delay time $t_1$ from the time when a transition of the control signal SWT to the HIGH level is made to the time when the potential of the output signal OUTR is changed to the HIGH level is converted into an equivalent resistance value.

In this case, assume that the first PMOSFET 21a and the second PMOSFET 22a have the same operation characteristics, the first NMOSFET 21b and the second NMOSFET 22b have the same operation characteristics, and the first inverter 23 and the second inverter 28 have the same operation characteristics. Furthermore, if the first resistance element 1 and the second resistance element 27 have the same resistance value, the delay times for the column charge and the row charge are the same.

However, for example, when the resistance value $r_r$ of the first resistance element 1 is larger than the resistance value $r_c$ of the second resistance element 27, the ease of turning ON the switching transistor 2 differs depending on the direction in which a current flows. Specifically, the first resistance element 1 with a higher resistance value than that of the second resistance element 27 serves as the source of the switching transistor 2, the delay time $t_1$ when the row discharge is measured is larger than the delay time $t_0$ when the column discharge is measured.

As has been described, according to the fourth embodiment, which of the first resistance element 1 and the second resistance element 27 has become in a high resistance state can be determined, and such physical analysis can be performed in a simple manner.

(Fifth Embodiment)

Hereinafter, a fifth embodiment of the present invention will be described with reference to the accompanying drawings.

Figure 10:
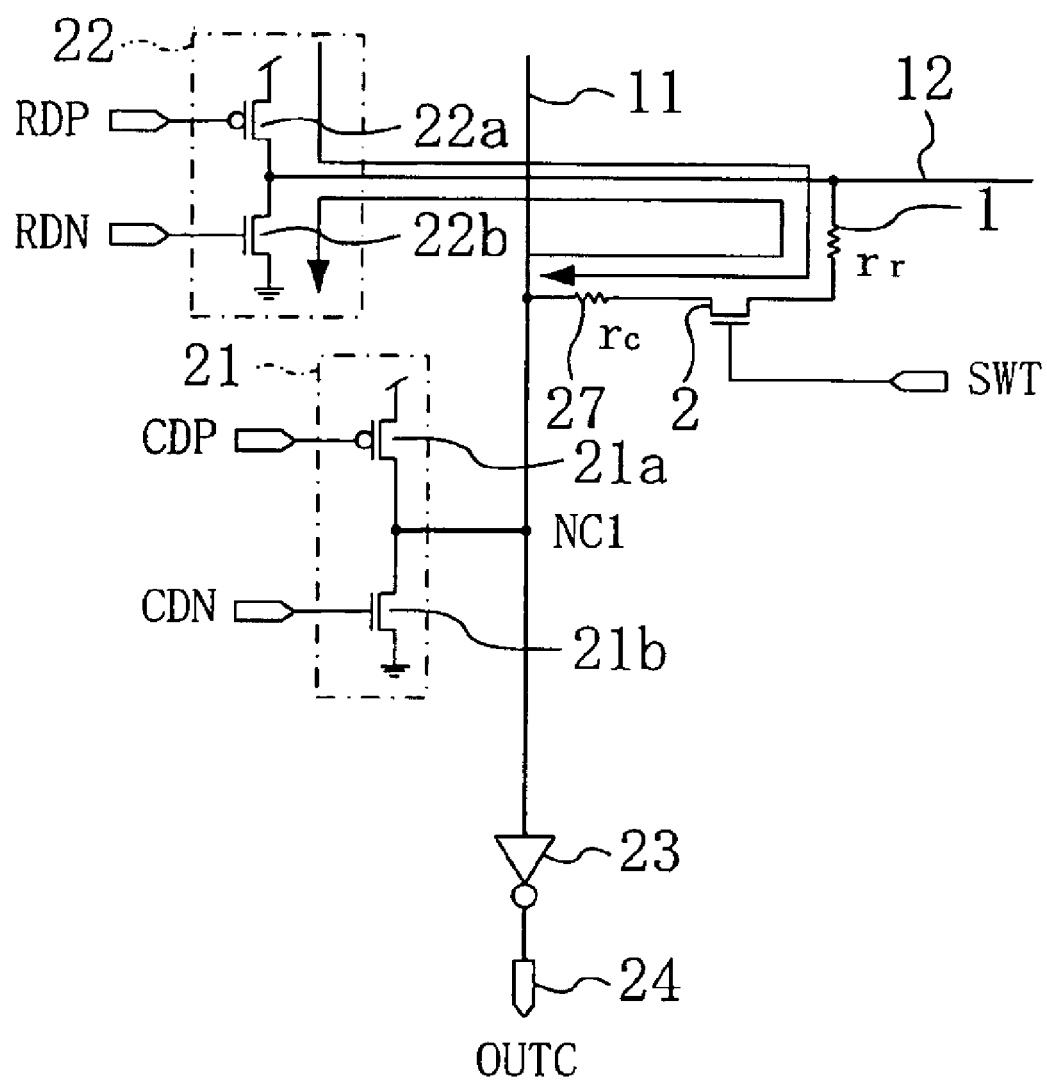
FIG. 10 is a circuit diagram schematically illustrating a unit circuit of an evaluation device for evaluating a semiconductor device according to a fifth embodiment of the present invention.

FIG. 10 is a circuit diagram illustrating a circuit configuration of a unit circuit of an evaluation device for evaluating a semiconductor device according to a fifth embodiment of the present invention. In FIG. 10, each member also shown in FIG. 6 is identified by the same reference numeral and therefore description thereof will be omitted.

The semiconductor device evaluation device of the fifth embodiment with the same configuration as that of the third embodiment allows measurement of a resistance value of a resistance element by a row power supply line.

A method for evaluating a resistance value of a via chain built in a semiconductor device evaluation device formed so as to have the above-described configuration will be described with reference to the accompanying drawings.

First, a method for measuring a resistance value by discharge (column discharge) from the output terminal 24 by the column power supply line 11 will be described.

Figure 11A:
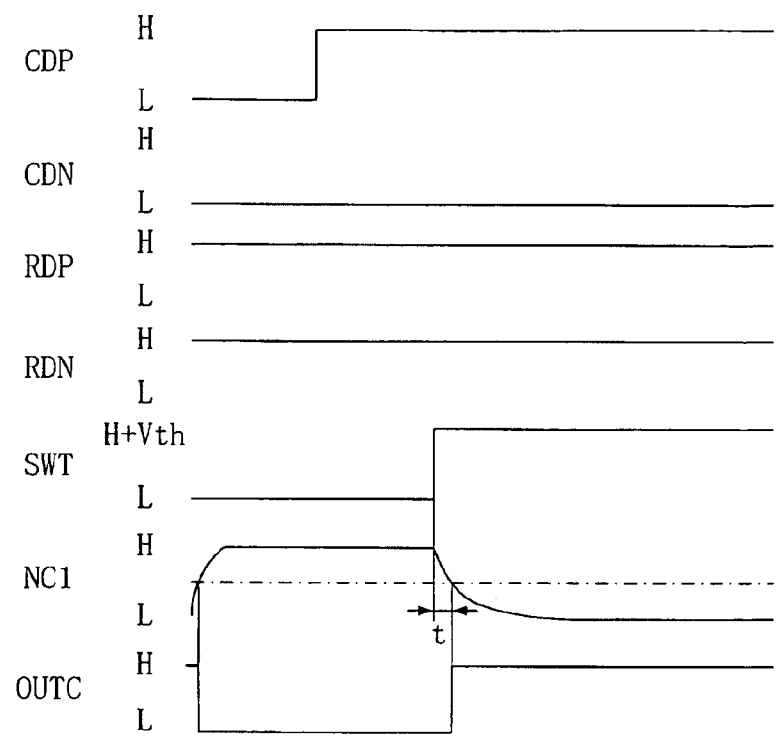
FIG. 11A is a timing chart when a resistance value is measured by discharge for a resistance element constituting a unit circuit of the evaluation device for evaluating a semiconductor device according to the fifth embodiment of the present invention.

As shown in FIG. 11A, with the potential of the control signal SWT set at the LOW level, each of the signal potentials of the first column drive signal CDP and the second column drive signal CDN is set at the LOW level and each of the signal potentials of the first row drive signal RDP and the second row drive signal RDN is set at the HIGH level. Thus, charges are charged from the power supply terminal of the column driver circuit 21 to the column power supply line 11 connected to the node NC1 via the first PMOSFET 21a, so that the potential of the node NC1 becomes the HIGH level.

Subsequently, after the potential of the node NC1 has become the HIGH level, a transition of the potential of the first column drive signal CDP to the HIGH level is made, thereby making the node NC1 be in a high impedance state. In this high impedance state, the potential of the output signal OUTC from the output terminal 24 is at the LOW level.

Next, the potential of the control signal SWT is increased to a voltage obtained by adding threshold voltage Vth of the switching transistor 2 to the power supply potential (H) (which will be hereinafter represented by H+Vth), so that charges stored in the column power supply line 11 connected to the node NC1 flow to the ground terminal via the second resistance element 27, the switching transistor 2, the first resistance element 1, and the second NMOSFET 22b. In this case, the velocity of decrease in the potential at the node NC1 varies according to an outflow level of charges, i.e., the resistance values of the first resistance element 1 and the second resistance element 27. Thereafter, at the time when the potential at the node NC1 is reduced to half of the HIGH level potential, the potential of the output signal OUTC becomes the HIGH level due to a reverse operation of the inverter 23. Then, a delay time from the time when the potential of the control signal SWT is set at H+Vth to the time when the potential of the output signal OUTC is changed to the HIGH level is converted to an equivalent resistance value.

Next, a method for measuring a resistance value by discharge (column charge) from the row driver circuit 22 by the row power supply line 12 will be described.

Figure 11B:
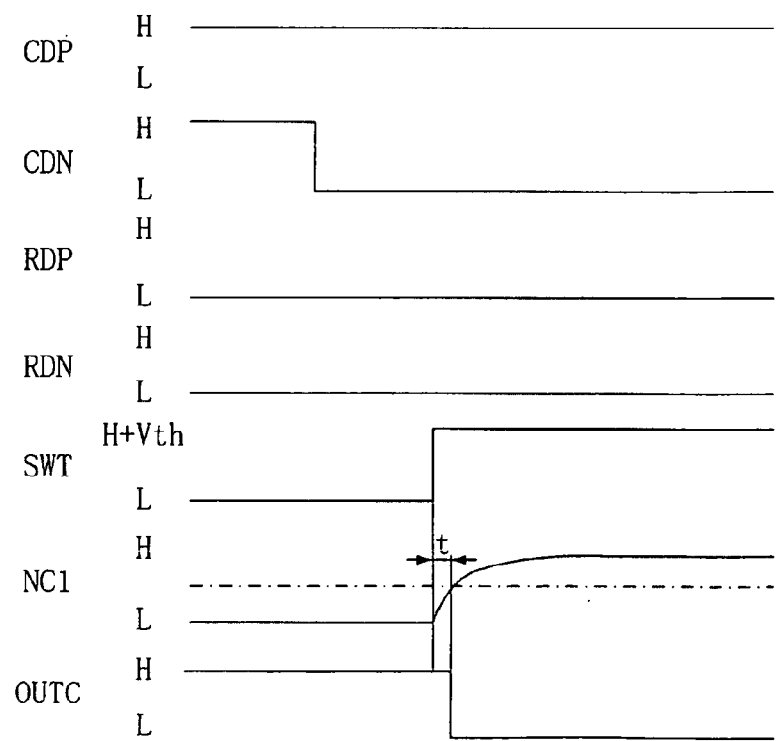
FIG. 11B is a timing chart when a resistance value is measured by charge for a resistance element constituting a unit circuit of the evaluation device for evaluating a semiconductor device according to the fifth embodiment of the present invention.

As shown in FIG. 11B, with the potential of the control signal SWT set at the LOW level, each of the signal potentials of the first column drive signal CDP and the second column drive signal CDN is set at the HIGH level and each of the signal potentials of the first row drive signal RDP and the second row drive signal RDN is set at the LOW level. Thus, the potential at the node NC1, i.e., an output terminal of the column driver circuit 21 becomes the LOW level.

Next, after the potential of the node NC1 has become the LOW level, a transition of the potential of the second column drive signal CDN to the LOW level is made, thereby making the node NC1 be in a high impedance state. In this high impedance state, the potential of the output signal OUTC from the output terminal 24 is at the HIGH level.

Next, a transition of the potential of the control signal SWT to H+Vth is made, so that charges are stored in the column power supply line 11 connected to the node NC1 from the power supply terminal of the row driver circuit 22 via the second PMOSFET 22a, the first resistance element 1, the switching transistor 2, and the second resistance element 27. In this case, the velocity of decrease in the potential at the node NC1 varies according to an outflow level of charges, i.e., the resistance values of the first resistance element 1 and the second resistance element 27. More specifically, when the resistance value is relatively high, the velocity of decrease in the potential is small, and when the resistance value is relatively low, the velocity of decrease in the potential is large.

Thereafter, at the time when the potential at the node NC1 is reduced to half of the HIGH level potential, the potential of the output signal OUTC becomes the LOW level by the inverter 23. Then, a delay time t from the time when the potential of the control signal SWT is set at H+Vth to the time when the potential of the output signal OUTC is changed to the LOW level is converted into an equivalent resistance value.

As has been described, according to the fifth embodiment, the resistance values of the resistance elements 1 and 27 as evaluation targets can be measured. Therefore, which of the first resistance element 1 and the second resistance element 27 has become in a high resistance state can be determined without providing the second inverter 28 shown in FIG. 8.

(Sixth Embodiment)

Hereinafter, a sixth embodiment of the present invention will be described with reference to the accompanying drawings.

Figure 12:
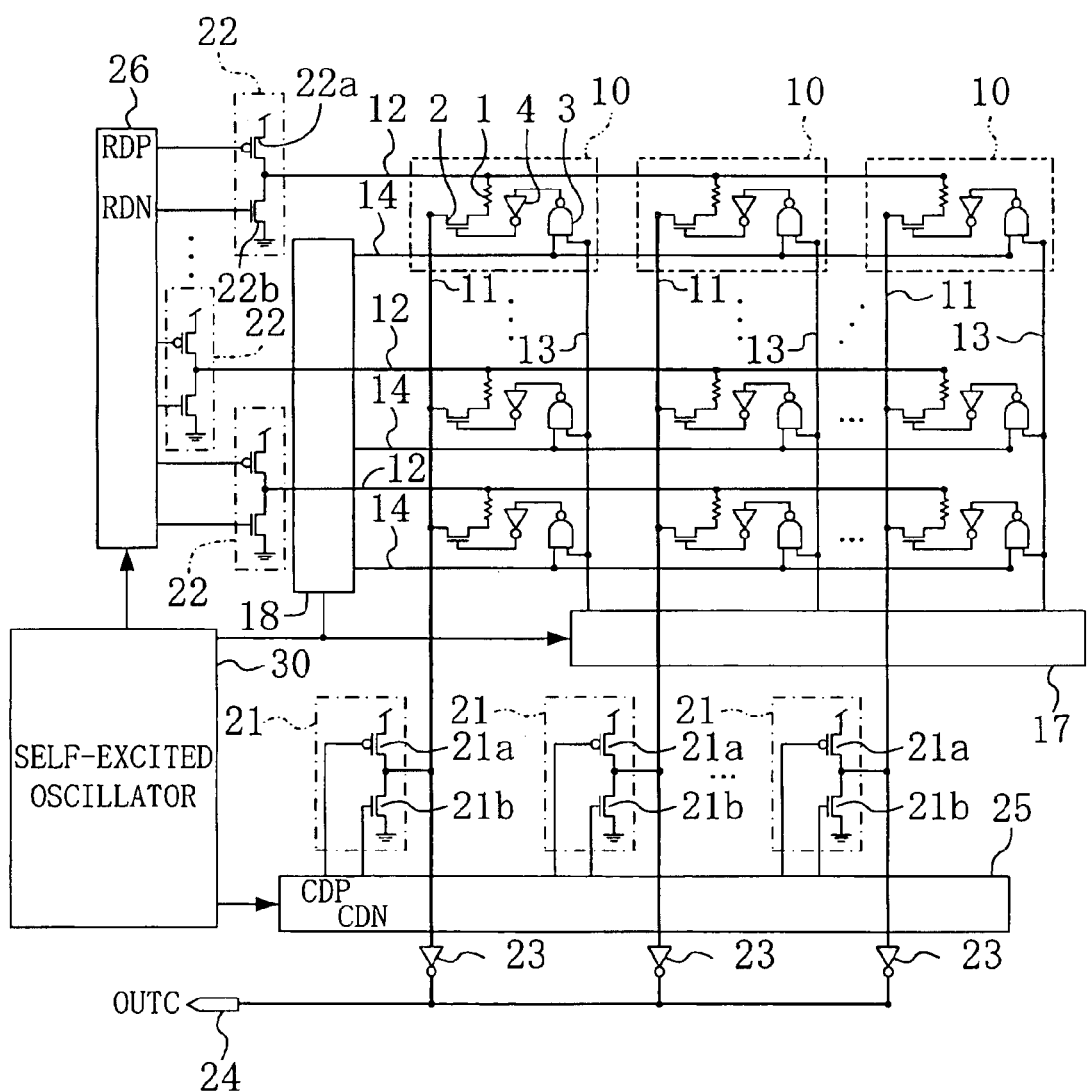
FIG. 12 is a circuit diagram illustrating an evaluation device for evaluating a semiconductor device according to a sixth embodiment of the present invention.

FIG. 12 is a circuit diagram illustrating the circuit configuration of an evaluation device for evaluating a semiconductor device according to a sixth embodiment of the present invention. In FIG. 12, each member also shown in FIG. 5 is identified by the same reference numeral and therefore description thereof will be omitted.

The semiconductor device evaluation device of the sixth embodiment has, in addition to the configuration of the second embodiment, a configuration which allows application of a stress current by an internal signal generated in the device.

Specifically, as shown in FIG. 12, the semiconductor device evaluation device of the sixth embodiment includes a self-excited oscillator circuit 30 connected to each of the column address controller 17, the row address controller 18, the column driver controller 25, and the row driver controller 26.

Each of the controllers 17, 18, 25 and 26 generates a control signal of each type, based on a signal input from the self-excited oscillator circuit 30, thereby successively applying a stress current to the plurality of unit circuits 10.

With the configuration described above, a stress current can be applied without inputting a control signal from the outside, for example, in a burn-in test.

(Seventh Embodiment)

Hereinafter, a seventh embodiment of the present invention will be described with reference to the accompanying drawings.

Figure 13:
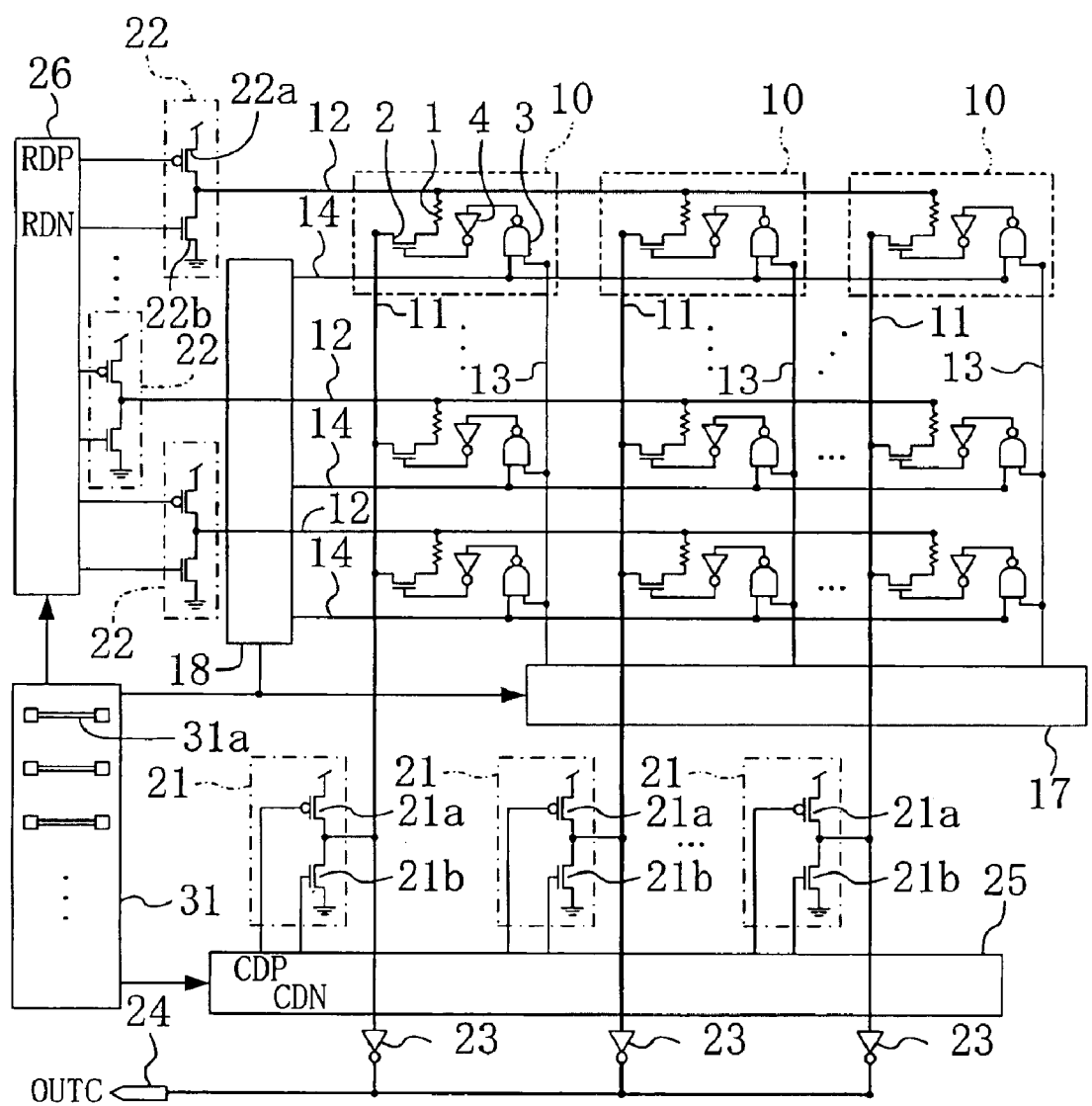
FIG. 13 is a circuit diagram illustrating an evaluation device for evaluating a semiconductor device according to a seventh embodiment of the present invention.

FIG. 13 is a circuit diagram illustrating the circuit configuration of an evaluation device for evaluating a semiconductor device according to a seventh embodiment of the present invention. In FIG. 13, each member also shown in FIG. 5 is identified by the same reference numeral and therefore description thereof will be omitted.

The semiconductor device evaluation device of the seventh embodiment has, in addition to the configuration of the second embodiment, a configuration which allows physical analysis in a simpler manner by providing a fuse element.

Specifically, as shown in FIG. 13, the semiconductor device evaluation device of the seventh embodiment includes a fuse circuit 31 including a plurality of fuse elements 31a for uniquely determining a connection of each unit circuit 10 and each of the column address controller 17, the row address controller 18, the column driver controller 25 and the row driver controller 26. In this case, the number of the fuse elements 31a is, for example, m+n when the unit circuits 10 are arranged in $2^m$ rows and $2^n$ columns. Note that m and n are integers where m=n holds.

According to combinations of cut sections of the plurality of fuse elements 31a, a fixed control signal pattern is input into each of the controllers 17, 18, 25 and 26. Thus, only by applying a potential to each of two terminals, i.e., the power supply terminal and the ground terminal, an evaluation current flows only in specific one of the unit circuits 10. As a result, using a failure analysis method such as an optical beam induced resistance change (OBIRCH) method and a liquid crystal method, a via with an increased resistance can be specified in a simple manner.

As has been described, according to the seventh embodiment, the location of a via with an increased resistance can be reliably specified among several hundred millions vias provided per wafer.

(Eighth Embodiment)

Hereinafter, an eighth embodiment of the present invention will be described with reference to the accompanying drawings.

Figure 14:
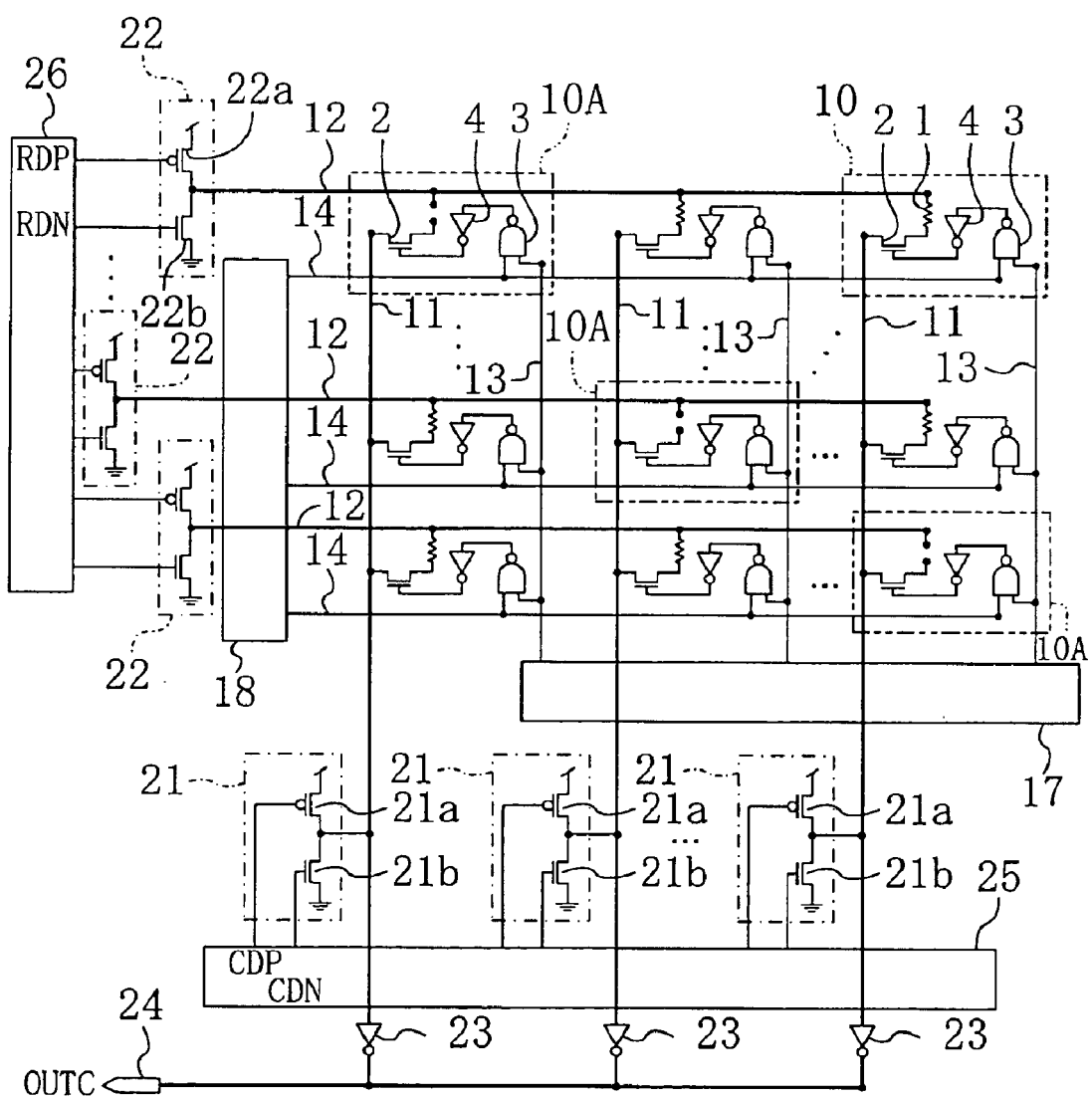
FIG. 14 is a circuit diagram illustrating an evaluation device for evaluating a semiconductor device according to an eighth embodiment of the present invention.

FIG. 14 is a circuit diagram illustrating the circuit configuration of an evaluation device for evaluating a semiconductor device according to an eighth embodiment of the present invention. In FIG. 14, each member also shown in FIG. 5 is identified by the same reference numeral and therefore description thereof will be omitted.

In the eighth embodiment, defective unit circuits 10A are intentionally made for the plurality of unit circuits 10 of the second embodiment, thereby forming a configuration which allows reliable checking of circuit operation.

As shown in FIG. 14, in the semiconductor device evaluation device of the eighth embodiment, the open unit circuits 10A each including the switching transistor 2 of which the drain is electrically open are arranged on a diagonal of a matrix, for example, so that addresses of the unit circuits 10A are set at (m, 1), ((m−1), 2), . . . , ((2, (n−1)) and (1, n).

A method for measuring a resistance value of each resistance element 1 using a semiconductor device evaluation device having the above-described configuration will be described.

First, assume that each of expected values for measurement results obtained from respective corresponding addresses to the open unit circuits 10A is a false (fail). On the other hand, each of expected values for measurement results obtained from respective corresponding addresses to the rest of the normal unit circuits 10 is assumed to be a truth (pass). When all of the unit circuits 10 are normally operated, each of the measurement results for the unit circuits 10 should match expected values and, therefore, be determined to be a pass.

However, for example, when a problem arises in the evaluation device or a peripheral circuit thereof and an output value from an output terminal is fixed to the HIGH level or the LOW level, measurement results do not match respective expected values of corresponding addresses to the open unit circuits 10A. Therefore, it is determined that a problem has occurred.

With the configuration described above, whether the entire evaluation device functions can be checked.

Note that the open unit circuits 10A are arranged on a diagonal of a matrix. However, the arrangement of the open unit circuits 10A is not limited thereto but the open unit circuits 10A may be arranged so that each of the column power supply lines 11 and the row power supply lines 12 has at least an intersection of a column power supply line and a row power supply line.

(Ninth Embodiment)

Hereinafter, a ninth embodiment of the present invention will be described with reference to the accompanying drawings.

Figure 15:
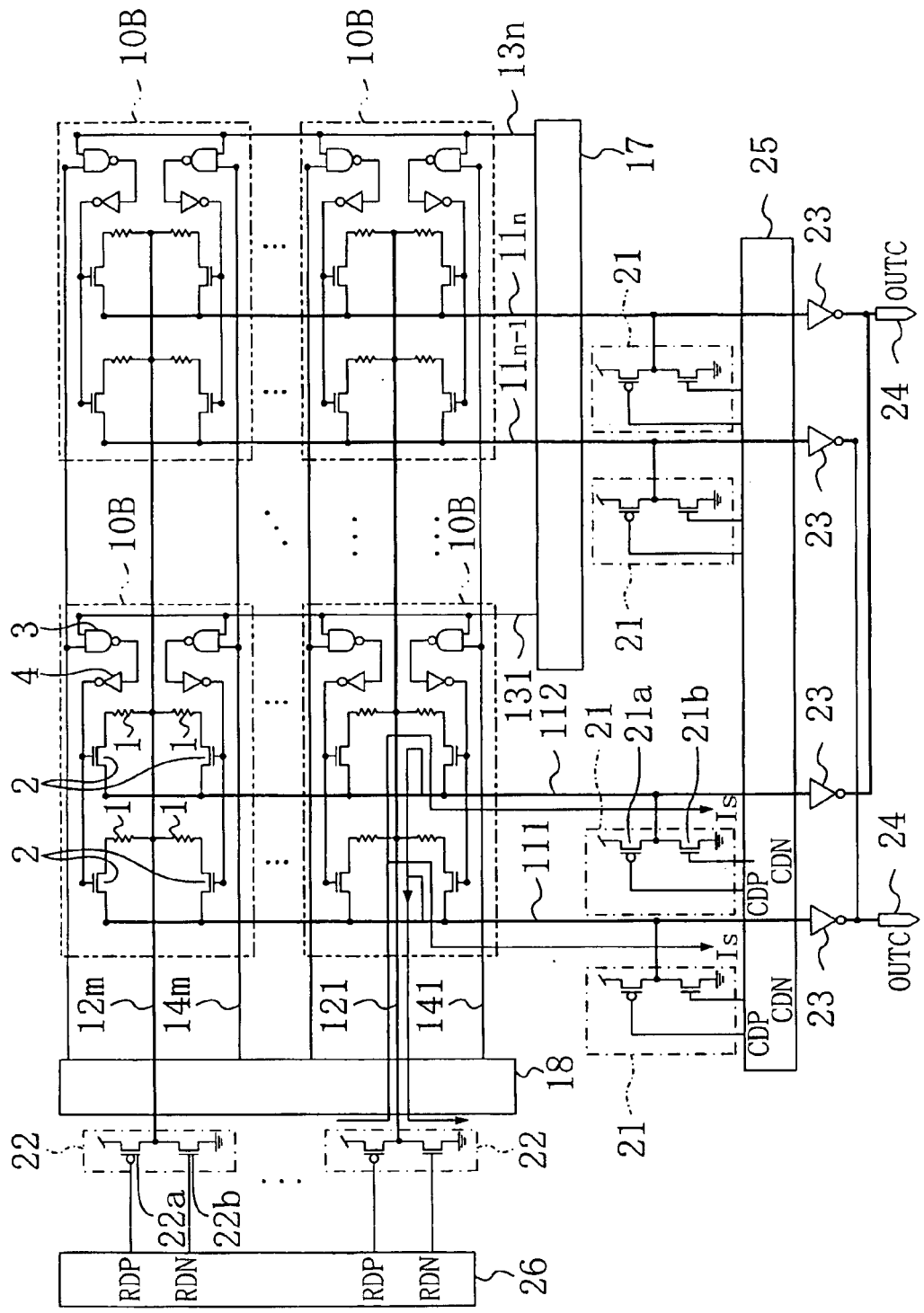
FIG. 15 is a circuit diagram illustrating an evaluation device for evaluating a semiconductor device according to a ninth embodiment of the present invention.

FIG. 15 is a circuit diagram illustrating the circuit configuration of an evaluation device for evaluating a semiconductor device according to a ninth embodiment of the present invention. In FIG. 15, each member also shown in FIG. 5 is identified by the same reference numeral and therefore description thereof will be omitted.

The semiconductor device evaluation device of the ninth embodiment has a configuration which allows multiple existence and selection of the resistance element 1.

As shown in FIG. 15, for example, each unit circuit 10B is connected to two column power supply lines 111 and 112 and a row power supply line 12m.

To the column power supply line 111, each of the respective sources of two switching transistors 2 is connected in parallel and each of the respective drains of the switching transistors 2 is connected to the row power supply line 12m in parallel via the resistance element 1 (via chain). The gate of each of the switching transistors 2 located adjacent to each other along the row power supply line 12m is connected to the 2-input NAND gate 3 via the inverter 4.

Accordingly, each of the unit circuits 10B includes four resistance elements 1, four switching transistors 2, two 2-input NAND gates 3, and two inverters 4. Moreover, the unit circuits 10B are arranged in (m/2) rows and (n/2) columns.

Hereinafter, an evaluation method for evaluating a via chain built in a semiconductor device evaluation device formed so as to have the above-described configuration will be described with reference to the accompanying drawings.

In this case, the case where a stress current is applied to ones of the unit circuits 10B arranged in the first row and the first column will be described.

First, the potential of the first row drive signal RDP in the row driver circuit 22 connected to ones of the unit circuits 10B arranged in the first column is set at the LOW level by the row drive controller 26, thereby turning ON the second PMOSFET 22a. At the same time, the potential of each of the respective second column drive signals CDN in the two column driver circuits 21 connected to each of the unit circuits 10B arranged in the first row is set at the HIGH level by the column driver controller 25, thereby turning ON each of the first NMOSFETs 21b.

Next, each of the potentials of the column address signal line 131 connected to the column address controller 17 and the row address signal line 141 connected to the row address controller 18 is set at the HIGH level, thereby turning ON only two of the switching transistors 2 connected to the column power supply lines 111 and 112 and the row power supply line 121. Thus, the stress current Is flows in each of the resistance elements 1 connected each of the two switching transistors 2 in an ON state.

Next, the two switching transistors 2 in an ON state are turned OFF again, and then by the row driver controller 26, the potential of the second row drive signal RDN in the row driver circuit 22 connected to each of the unit circuits 10B arranged in the first column is set at the HIGH level, thereby turning ON only the second NMOSFET 22b.

Next, by the column driver controller 25, each of the potentials of the two column driver circuits 21 each connected to one of the unit circuits 10B arranged in the first row is set at the LOW level, thereby turning ON each of the first PMOSFETs 21a. Thus, the column power supply lines 111 and 112 are charged to be the HIGH level.

Next, each of the first PMOSFETs 21a in an ON state is turned OFF again, so that the column power supply lines 111 and 112 are electrically floating as well as being charged to be the HIGH level potential.

Next, only two of the switching transistors 2 connected to the column power supply lines 111 and 112 and the row power supply line 121 are selectively turned ON again. As a result, charges stored in the column power supply lines 111 and 112 flows to the ground terminal via the switching transistors 2, the resistance elements 1, the row power supply line 121 and the second NMOSFET 22b. Thereafter, at the time when each of the potentials of the column power supply lines 111 and 112 is reduced to half of the power supply potential, by the inverters 23 connected to each of the column power supply lines 111 and 112, respectively, the respective potentials of the output signals OUTC are reversed from the LOW level to the HIGH level and then output from the respective output terminals 24.

Then, a time which it takes from the time when the switching transistors 2 has been turned ON to reverse the inverters 23 is converted into an equivalent resistance value. Thus, the resistance values of two of the resistance elements 1 can be simultaneously measured.

As has been described, according to the ninth embodiment, one of the unit circuits 10B is accessed, so that a stress current can be applied simultaneously to two of the resistance elements 1 and the resistance values of the two resistance elements 1 can be measured simultaneously. Therefore, an evaluation time can be reduced to half.

Note that in this case, two of the switching transistors 2 are connected to the control signal lines for controlling the respective gates of the switching transistors 2. However, the numbers of the switching transistors connected thereto may be three or more and is not limited.

(Tenth Embodiment)

Hereinafter, a tenth embodiment of the present invention will be described with reference to the accompanying drawings.

Figure 16:
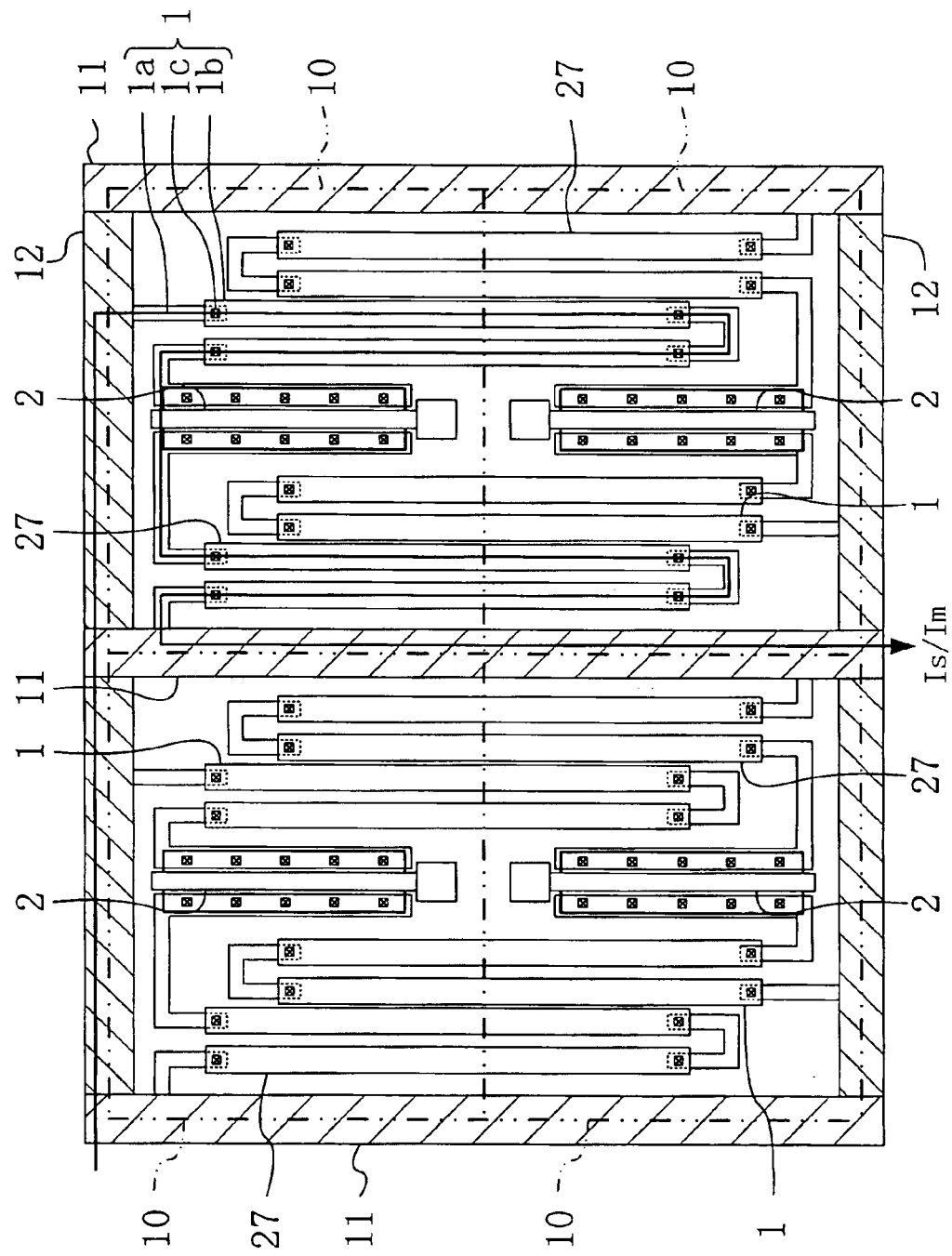
FIG. 16 is a diagram illustrating a layout of a unit circuit in an evaluation device for evaluating a semiconductor device according to a tenth embodiment of the present invention.
Figure 17:
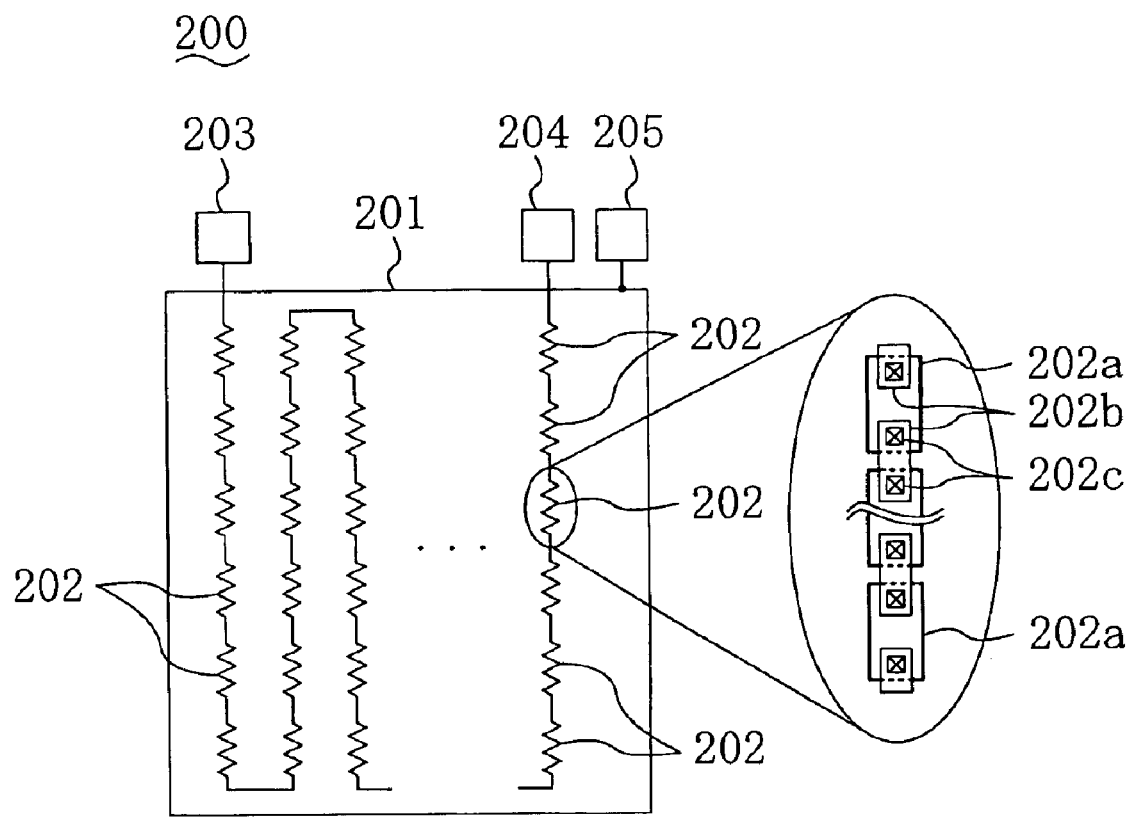
FIG. 17 is a plan view schematically illustrating a cross-sectional configuration of an evaluation device for evaluating a semiconductor device according to a first known example.
Figure 18:
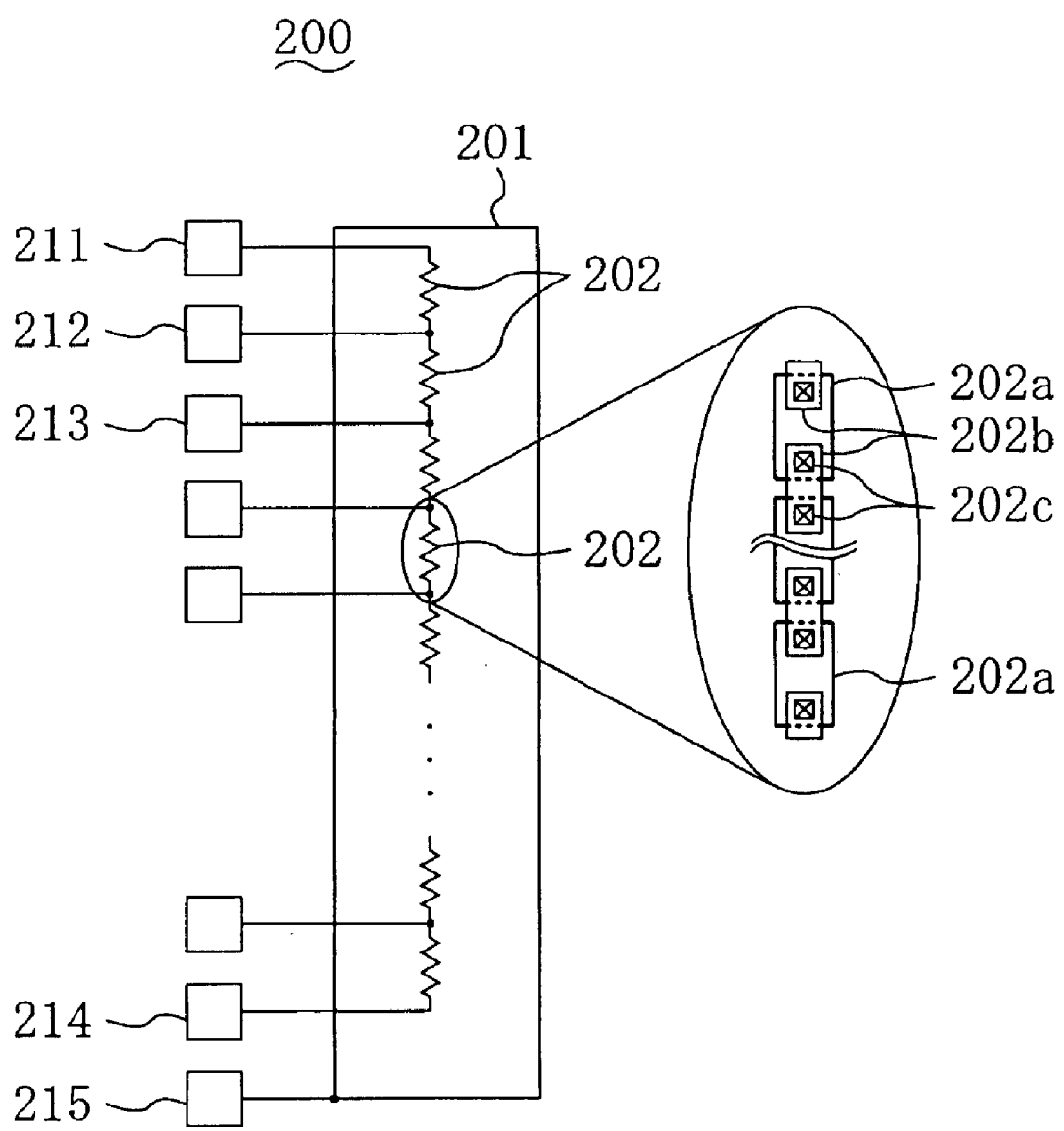
FIG. 18 is a plan view schematically illustrating a cross-sectional configuration of an evaluation device for evaluating a semiconductor device according to a second known example.

FIG. 16 is a plan view of a unit circuit in an evaluation device for evaluating a semiconductor device according to the tenth embodiment and illustrates an exemplary layout of, for example, the unit circuit of the third embodiment which includes the first resistance element 1 and the second resistance element 27. In FIG. 16, each member also shown in FIG. 6 is identified by the same reference numeral and therefore description thereof will be omitted.

As shown in FIG. 16, in each unit circuit 10, the drain of the switching transistor 2 is connected to the row supply line 12 via the first resistance elements (via chain) 1 and the source of the switching transistor 2 is connected to the column power supply line 11 via the second resistance elements (via chain) 27. Moreover, each of the resistance elements 1 includes the lower layer interconnect 1a, the upper layer power supply line 1b and the via 1c and each of the second resistance elements 27 has the same configuration.

As a characteristic of the tenth embodiment, in ones of the unit circuits 10 located adjacent to each other in the direction in the column power supply line 11 extends, the first resistance elements 1 and the second resistance elements 2 are provided so that an interconnect portion constituting each of the first and second resistance elements 1 and 2 in one of the adjacent unit circuits 10 extends onto the other one of the adjacent unit circuits 10. Therefore, an interconnect of the row power supply line 12 or the like is not provided between the ones of the unit circuits 10 located adjacent to each other in the direction in which the column power supply line 11 extends.

For example, each of the stress current Is and the resistance measurement current Im flows through the row power supply line 12, the first resistance elements 1, the switching transistor 2, the second resistance elements 27 and the column power supply line 11 in this order.

As has been described, according to the tenth embodiment, each of the resistance elements (via chains) 1 and 27 are arranged so as to extend over the adjacent ones of the unit circuits 10, so that a relatively long interconnect itself can be evaluated even when the size of the unit circuits 10 is reduced and the unit circuits 10 are integrated at a high density.

Note that a configuration in which the second resistance elements 27 are not provided may be used.

What is claimed is:

1. An evaluation device for evaluating a semiconductor device, which is formed on a substrate and used for evaluating electric characteristics of an electrical connection member provided in a vertical direction to the substrate, the evaluation device comprising: a unit circuit including a switching transistor in which a gate thereof connected to a signal line and one of a source and a drain thereof connected to a first interconnect, and a first resistance element having one terminal connected to the other one of the source and the drain of the switching transistor and the other terminal connected to a second interconnect, wherein the first resistance element includes at least one electrical connection member.

2. The evaluation device of claim 1, further comprising: a second resistance element connected between the switching transistor and the first interconnect.

3. The evaluation device of claim 2, wherein the substrate is formed of a semiconductor, and wherein the first resistance element or the second resistance element is an active layer formed on the substrate.

4. The evaluation device of claim 2, wherein the substrate is formed of a semiconductor, and wherein at least one of the first resistance element and the second resistance element is a MIS transistor formed on the substrate.

5. The evaluation device of claim 1, further comprising:

a first circuit including a pair of transistors of different conductivity types connected in series between a power supply terminal and a ground terminal with a connection node of the transistors connected to the first interconnect; and a second circuit including a pair of transistors of different conductivity types connected in series between a power supply terminal and a ground terminal with a connection node of the transistors connected to the second interconnect, wherein the first interconnect is connected to a first output terminal via a first voltage detector.

6. The evaluation device of claim 5, wherein the second interconnect is connected to a second output terminal via a second voltage detector.

7. The evaluation device of claim 6, wherein the second voltage detector is an inverter or a differential amplifier.

8. The evaluation device of claim 5, wherein a voltage equal to or higher than a sum of a power supply voltage and a threshold voltage of the switching transistor is applied to the signal line.

9. The evaluation device of claim 5, wherein the first voltage detector is an inverter or a differential amplifier.

10. The evaluation device of claim 1, wherein the unit circuit is provided plural in number and the plurality of unit circuits are arranged in a matrix on the substrate.

11. The evaluation device of claim 1, wherein the substrate is formed of a semiconductor, and wherein the first resistance element includes an active layer formed on the substrate.

12. The evaluation device of claim 1, wherein the substrate is formed of a semiconductor, and wherein the first resistance element includes a MIS transistor formed on the substrate.

13. The evaluation device of claim 1, wherein the electrical connection member is a contact or a via.

14. An evaluation device for evaluating a semiconductor device, which is formed on a substrate and used for evaluating electric characteristics of an electrical connection member provided in a vertical direction to a substrate, the evaluation device comprising: a unit circuit including a plurality of switching transistors each having a configuration in which a gate thereof connected to a signal line and one of a source and a drain thereof connected to a first interconnect, and a plurality of first resistance elements each having a terminal connected to the other one of the source and the drain of the switching transistor and the other terminal connected to a second interconnect, wherein each said first resistance element includes at least one electrical connection member.

15. The evaluation device of claim 14, wherein the unit circuit is provided plural in number and the plurality of unit circuits are arranged in a matrix on the substrate.

16. An evaluation device for evaluating a semiconductor device, which is formed on a substrate and used for evaluating electric characteristics of an electrical connection member provided in a vertical direction to a substrate surface, the evaluation device comprising:

a plurality of unit circuits arranged in a matrix, each including a switching transistor in which a gate thereof connected to an output terminal of a NAND circuit and one of a source and a drain thereof connected to a first interconnect, and a first resistance element having one terminal connected to the other one of the source and the drain of the switching transistor and the other terminal connected to a second interconnect, wherein the first resistance element includes at least one electrical connection member, wherein the second interconnect connected to the first resistance element of each one of the plurality of unit circuits belonging to the same row is a single interconnect in a row direction, wherein one input terminal of the NAND circuit included in each one of the plurality of unit circuits belonging to the same row is connected to a row address control section, wherein the first interconnect connected to the switching transistor included in each one of the plurality of unit circuits belonging to the same column is a single interconnect in a column direction, and wherein the other input terminal of the NAND circuit included in each one of the plurality of circuits belonging to the same column is connected to a column address control section.

17. The evaluation device of claim 16, further comprising:

a plurality of first circuits each including a pair of transistors of different conductivity types connected in series between a power supply terminal and a ground terminal with a connection node of the transistors connected to the column direction interconnect;

a plurality of second circuits each including a pair of transistors of different conductivity types connected in series between a power supply terminal and a ground terminal with a connection node of the transistors connected to the row direction interconnect;

a column driver control section for outputting a control signal to a gate of each of the pair of transistors in each said first circuit; and a row driver control section for outputting a control signal to a gate of each of the pair of transistors in each said second circuit, wherein the column direction interconnect is connected to an output terminal via a voltage detector.

18. The evaluation device of claim 17, further comprising:

a self-excited oscillator circuit for outputting a control signal to each of the row address control section, the column address control section, the row driver control section and the column driver control section.

19. The evaluation device of claim 17, wherein the voltage detector is an inverter or a differential amplifier.

20. The evaluation device of claim 16, further comprising:

a plurality of second resistance elements connected between each said switching transistor and the first interconnect.

21. The evaluation device of claim 20, wherein the each said first resistance element and each said second resistance element are arranged so as to extend over adjacent ones of the plurality of unit circuits.

22. The evaluation device of claim 16, further comprising:

at least a fuse element for making it possible to select and drive specific one of the plurality of unit circuits.

23. The evaluation device of claim 16, wherein a current does not flow in respective switching transistors of ones of the plurality of unit circuits located on a diagonal of the matrix.

24. The evaluation device of claim 16, wherein the electrical connection member is a contact or a via.

25. An evaluation device for evaluating a semiconductor device, which is formed on a substrate and used for evaluating electrical characteristics of an electrical connection member provided in a vertical direction to a substrate surface, the evaluation device comprising:

a plurality of unit circuits arranged in a matrix, each including a plurality of switching transistors each having a configuration in which a gate of each said switching transistor connected to an output terminal of a NAND circuit and one of a source and a drain of each said switching transistor is connected to a first interconnect, and a plurality of first resistance elements each having one terminal connected to the other one of the source and the drain of each said switching transistor and the other terminal connected to a second interconnect, wherein each said first resistance element includes at least one electrical connection member, wherein the second interconnect connected to the plurality of first resistance elements of each one of the plurality of unit circuits belonging to the same row is a single interconnect in a row direction, wherein one input terminal of the NAND circuit included in each one of the plurality of unit circuits belonging to the same row is connected to a row address control section, wherein the first interconnect connected to the plurality of switching transistors included in each one of the plurality of unit circuits belonging to the same column is a single interconnect in a column direction, and wherein the other input terminal of the NAND circuit included in each one of the plurality of unit circuits belonging to the same column is connected to a column address control section.

* * * * *